United States Patent
Burns et al.

(10) Patent No.: US 9,852,946 B1
(45) Date of Patent: Dec. 26, 2017

(54) SELF ALIGNED CONDUCTIVE LINES

(71) Applicant: INTERNATIONAL BUSINESS MACHINES CORPORATION, Armonk, NY (US)

(72) Inventors: Sean D. Burns, Hopewell Junction, NY (US); Lawrence A. Clevenger, LaGrangeville, NY (US); Matthew E. Colburn, Schenectady, NY (US); Sivananda K. Kanakasabapathy, Niskayuna, NY (US); Yann A. M. Mignot, Slingerlands, NY (US); Christopher J. Penny, Saratoga Springs, NY (US); Roger A. Quon, Rhinebeck, NY (US); Nicole Saulnier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/176,279

(22) Filed: Jun. 8, 2016

(51) Int. Cl.
*H01L 21/4763* (2006.01)
*H01L 21/768* (2006.01)

(52) U.S. Cl.
CPC .. *H01L 21/76897* (2013.01); *H01L 21/76802* (2013.01); *H01L 21/76843* (2013.01)

(58) Field of Classification Search
CPC ............. H01L 21/0334; H01L 21/0337; H01L 21/0338; H01L 21/76897; H01L 21/76892; H01L 21/76816
See application file for complete search history.

(56) References Cited

U.S. PATENT DOCUMENTS

| | | |
|---|---|---|
| 7,517,637 B2 | 4/2009 | Colburn et al. |
| 8,415,089 B1 | 4/2013 | Gupta et al. |
| 8,461,678 B2 | 6/2013 | Edelstein et al. |
| 8,669,186 B2 | 3/2014 | Licausi |
| 8,889,561 B2 | 11/2014 | Woo et al. |

(Continued)

FOREIGN PATENT DOCUMENTS

WO 2015047321 A1 4/2015

OTHER PUBLICATIONS

List of IBM Patents or Patent Applications Treated as Related; (Appendix P), Filed Jun. 13, 2016, 2 pages.

(Continued)

*Primary Examiner* — Selim Ahmed
*Assistant Examiner* — Evan Clinton
(74) *Attorney, Agent, or Firm* — Cantor Colburn LLP; Vazken Alexanian

(57) ABSTRACT

A method for forming conductive lines on a wafer comprises forming a first sacrificial mandrel and a second sacrificial mandrel. Spacers are formed adjacent to the first and second sacrificial mandrels. A filler material is deposited on the second hardmask. A first mask is formed on a portion of the second sacrificial mandrel. A first cavity and a second cavity are formed that expose portions of the second hardmask, and exposed portions of the second mask and exposed portions of the filler material are removed to expose portions of the first hardmask. Exposed portions of the first hardmask, the planarizing layer and the first hardmask are removed to expose portions of the insulator layer. Exposed portions of the insulator layer are removed to form a trench in the insulator layer and the trench is filled with a conductive material.

20 Claims, 31 Drawing Sheets

(56) References Cited

U.S. PATENT DOCUMENTS

| | | |
|---|---|---|
| 8,907,497 B2 | 12/2014 | Chang et al. |
| 9,064,813 B2 | 6/2015 | Kanakasabapathy et al. |
| 9,196,485 B2 | 11/2015 | Leobandung |
| 2009/0206489 A1 | 8/2009 | Li et al. |
| 2015/0035081 A1 | 2/2015 | Cheng et al. |
| 2015/0255300 A1 | 9/2015 | He et al. |
| 2015/0380300 A1 | 12/2015 | Wu et al. |

OTHER PUBLICATIONS

Sean D. Burns, et al., "Self Aligned Conductive Lines", U.S. Appl. No. 15/176,284, filed Jun. 8, 2016.
Sean D. Burns, et al., "Self Aligned Conductive Lines", U.S. Appl. No. 15/176,286, filed Jun. 8, 2016.

SELF ALIGNED CONDUCTIVE LINES

BACKGROUND

The present invention generally relates to complimentary metal-oxide semiconductors (CMOS) and metal-oxide-semiconductor field-effect transistors (MOSFET), and more specifically relates to conductive lines used in semiconductor devices.

The MOSFET is a transistor used for switching electronic signals. The MOSFET has a source, a drain, and a gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

The FinFET is a type of MOSFET. The FinFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

Gate spacers form an insulating film along gate sidewalls. Gate spacers may also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are largely determined by the wavelength of the irradiation.

SUMMARY

According to an embodiment of the present invention, a method for forming conductive lines on a semiconductor wafer comprises forming a first hardmask on an insulator layer, a planarizing layer on the first hardmask, a second hardmask on the planarizing layer and a layer of sacrificial mandrel material on the second hardmask. Portions of the layer of sacrificial mandrel material are removed to expose portions of the second hardmask and form a first sacrificial mandrel and a second sacrificial mandrel on the second hardmask. Spacers are formed adjacent to sidewalls of the first sacrificial mandrel and sidewalls of the second sacrificial mandrel. A filler material is deposited on the second hardmask between the first sacrificial mandrel and the second sacrificial mandrel and a first mask is formed on a portion of the second sacrificial mandrel. Exposed portions of the first sacrificial mandrel and the second sacrificial mandrel are removed to form a first cavity and a second cavity that expose portions of the second hardmask and the first mask is removed. A second mask is deposited that fills the first cavity and the second cavity, and a resist mask is formed over a portion of the filler material. Exposed portions of the second mask and exposed portions of the filler material are removed to expose portions of the first hardmask. The resist mask and exposed portions of the first hardmask, the planarizing layer and the first hardmask are removed to expose portions of the insulator layer. The planarizing layer, the second hardmask, the filler material, the sacrificial mandrel, and the spacers are removed to expose the first hardmask. Exposed portions of the insulator layer are removed to form a trench in the insulator layer, and the trench is filled with a conductive material.

According to another embodiment of the present invention, a method for forming conductive lines on a semiconductor wafer comprises forming a first hardmask on an insulator layer, a first planarizing layer on the first hardmask, a second hardmask on the first planarizing layer, and a first mask on the second hardmask. Exposed portions of the second hardmask are removed to expose portions of the first planarizing layer. A third hardmask is formed on the first hardmask and the exposed portions of the first planarizing layer. A layer of sacrificial mandrel material is formed on the third hardmask and a fourth hardmask is formed on the layer of sacrificial mandrel material. A second mask is formed on the fourth hardmask. Exposed portions of the fourth hardmask and the layer of sacrificial mandrel material are removed to expose portions of the third hardmask and form a first sacrificial mandrel and a second sacrificial mandrel. Spacers are formed adjacent to sidewalls of the first sacrificial mandrel and sidewalls of the second sacrificial mandrel and a second planarizing layer is formed adjacent to the spacers. Exposed portions of the first sacrificial mandrel and the second sacrificial mandrel are removed to form a first cavity and a second cavity. A depth of the first cavity and a depth of the second cavity are increased by removing exposed portions of the third hardmask, the second hardmask, and the first planarizing layer to expose portions of the first hardmask. Exposed portions of the first hardmask are removed to expose portions of the insulator layer. Exposed portions of the insulator layer are removed to form a first trench and a second trench. The first hardmask is removed, and the first trench and the second trench are filled with a conductive material.

BRIEF DESCRIPTION OF THE DRAWINGS

FIGS. 1-18 illustrate an exemplary embodiment of a method for forming conductive lines for a semiconductor device.

FIG. 1 illustrates a side view of a structure formed on a substrate.

FIG. 2 illustrates a side view following an etching process that selectively removes exposed portions of the sacrificial mandrel layer.

FIG. 3 illustrates a top view of the patterned resist arranged on the second hardmask.

FIG. 4 illustrates a side view following the deposition of a layer of spacer material over exposed portions of the second hardmask and the sacrificial mandrels.

FIG. 5 illustrates a side view following the formation of spacers along sidewalls of the sacrificial mandrels.

FIG. 8 illustrates a cut-away view following a selective etching process that removes exposed portions of the sacrificial mandrel.

FIG. 9 illustrates a top view of the resultant structure following the removal of the mask.

FIG. 12 illustrates a cut-away view following a selective etching process that removes exposed portions of the underlying second hardmask.

FIG. 13 illustrates a cut-away view following a selective anisotropic etching process that removes exposed portions of the organic planarization layer.

FIG. 14 illustrates a cut-away view following another selective anisotropic etching process that removes exposed portions of the first hardmask.

FIG. 15 illustrates a cut-away view of the resultant structure following the removal of the organic planarization layer, the second hardmask, the spacers, the non-mandrel line, and the sacrificial mandrel.

FIG. 16 illustrates a cut-away view following a selective etching process.

FIG. 17 illustrates a cut-away view following the deposition of a conductive material.

FIGS. 19-38B illustrate another exemplary embodiment of a method for forming conductive lines for a semiconductor device.

FIG. 19 illustrates a side view of a structure formed on a substrate.

FIG. 22 illustrates a cut-away view following the deposition of a third hardmask over exposed portions of the organic planarizing layer.

FIG. 24 illustrates a cut-away view of the resultant structure following a selective etching process.

FIG. 25 illustrates a cut-away view following the deposition of a layer of spacer material over the exposed portions of the third hardmask FIG. 26 illustrates a cut-away view following an anisotropic etching process such as, for example, reactive ion etching.

FIG. 27 illustrates a cut-away view following the deposition of a second organic planarization layer.

FIG. 28 illustrates a cut-away view following an etching or planarization process that removes portions of the second organic planarization layer.

FIG. 30 illustrates a cut-away view following a selective anisotropic etching process such as, for example, reactive ion etching.

FIG. 31 illustrates a cut-away view following a selective anisotropic etching process.

FIG. 32 illustrates a cut-away view following another selective anisotropic etching process.

FIG. 33 illustrates a cut-away view following another anisotropic etching process that removes non-obscured regions of the organic planarizing layer.

FIG. 35 illustrates a cut-away view following a selective anisotropic etching process.

FIG. 36 illustrates a cut-away view following a selective etching process that removes the first hardmask (of FIG. 35).

FIG. 37 illustrates a cut-away view following the deposition of a conductive material.

FIG. 38B illustrates a top view of the conductive lines arranged in the inter-level dielectric layer.

DETAILED DESCRIPTION

Conductive connections in semiconductor devices and integrated circuits often include conductive lines that are arranged in trenches formed in an insulating material. The conductive lines connect to devices in the circuit. Integrated circuits often have multiple layers of devices and conductive lines arranged on one or more wafers. Conductive vias are used to form electrical connections between different layers of an integrated circuit.

As the scale of semiconductor devices continues to decrease, aligning and patterning conductive lines in desired locations on the chip continues to become more challenging. Typically, in an integrated circuit having trenches filled with conductive material to form conductive lines, it is desirable to pattern the trenches using a self-alignment method to avoid misalignments. As the pitch of the trenches or lines scales down, the use of previous patterning methods has not resulted in a desired trench alignment.

The embodiments described herein provide for a method for patterning that distinguishes mandrel lines and non-mandrel lines on device during the formation of the conductive lines. The method allows vias to be selectively formed on either mandrel or non-mandrel lines.

FIGS. 1-18B illustrate an exemplary embodiment of a method for forming conductive lines for a semiconductor device.

Figure 1:
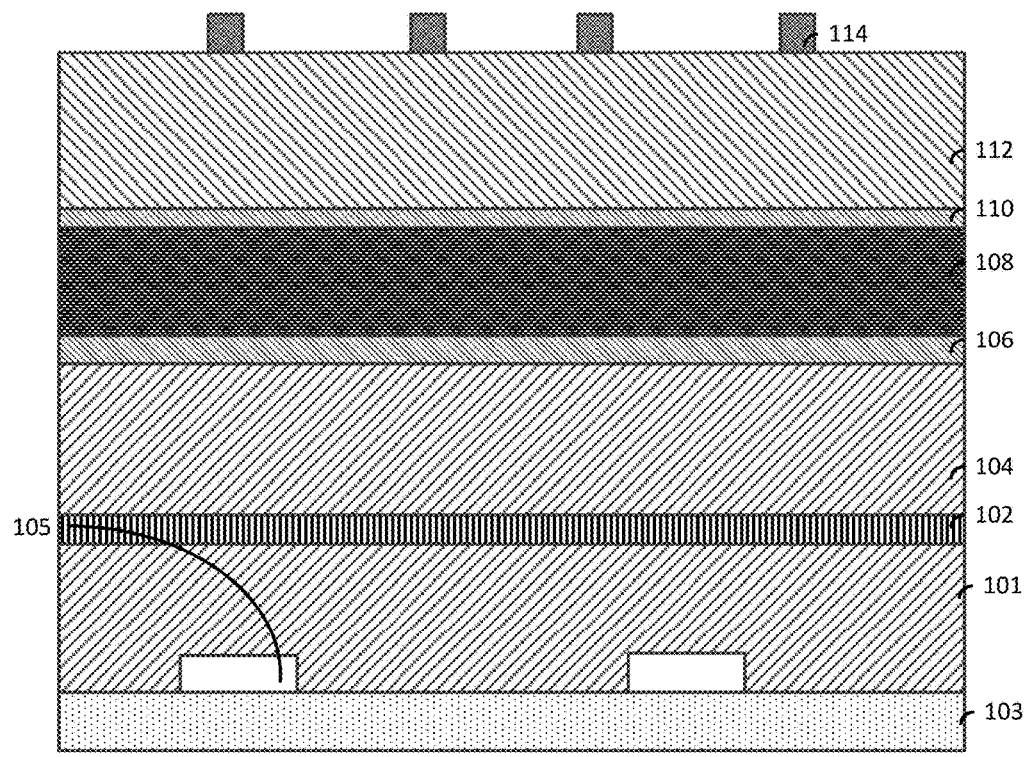

FIG. 1 illustrates a side view of a structure formed on a substrate 103. The substrate may include, for example, any suitable semiconductor material.

Non-limiting examples of suitable materials for the semiconductor layer 103 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials may include at least one "III element," such as aluminum (Al), boron (B), gallium (Ga), indium (In), and at least one "V element," such as nitrogen (N), phosphorous (P), arsenic (As), antimony (Sb).

Semiconductor devices 105 are arranged on the substrate 103. The semiconductor devices 105 may include, for example, MOSFET or other types of electronic devices. A layer of insulating material 101 such as, for example, an oxide material is arranged over the substrate 103 and the semiconductor devices 105. A conductive line 102 is arranged on the layer of insulating material 101. The conductive line 102 may include a conductive metallic material such as, for example, copper, aluminum, silver, gold, or another suitable conductive material.

One or more of the semiconductor devices 105 may be electrically connected to the conductive line 102. In the illustrated exemplary embodiments described herein a method for forming conductive lines that may connect with vias to the underlying conductive line 102 will be described.

FIG. 1 further includes an inter-level dielectric layer (insulator layer) 104 arranged on the conductive line 102. In the illustrated exemplary embodiment, the insulator layer 104 is an inter-level dielectric layer.

The inter-level dielectric layer 104 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 104 is deposited by a deposition process, including, but not limited to CVD, PVD, plasma enhanced CVD, atomic layer deposition (ALD), evaporation, chemical solution deposition, or like processes. Following the deposition of the inter-level dielectric layer 104, a planarization process such as, for example, chemical mechanical polishing is performed.

A first hardmask 106 is arranged on the inter-level dielectric layer 104. The first hardmask 106 may include, for example, titanium nitride, silicon oxide, silicon nitride (SiN), SiOCN, SiBCN or any suitable combination of those. The first hardmask 106 may be deposited using a deposition process, including, but not limited to, PVD, CVD, PECVD, or any combination thereof.

An organic planarization layer (OPL) 108 is arranged on the first hardmask 106. The OPL 108 may be deposited by, for example, a spin-on process followed by a bake. A second hardmask 110 is arranged on the organic planarization layer 108. The second hardmask 110 in the illustrated embodiment is similar to the first hardmask 106 however, in alternate exemplary embodiments, the first hardmask 106 and the second hardmask 110 may include dissimilar materials respectively.

A sacrificial mandrel layer 112 is arranged on the second hardmask 110. The sacrificial mandrel layer 112 in the illustrated exemplary embodiment includes an amorphous silicon material, alternate exemplary embodiments may include other materials such as, for example, an amorphous carbon material or a nitride material such as silicon nitride or titanium nitride.

A resist 114 is patterned on the sacrificial mandrel layer 112. Suitable resist masks include photoresists, electron-beam resists, ion-beam resists, X-ray resists and etch resists. The resist may a polymeric spin on material or a polymeric material.

Figure 2:
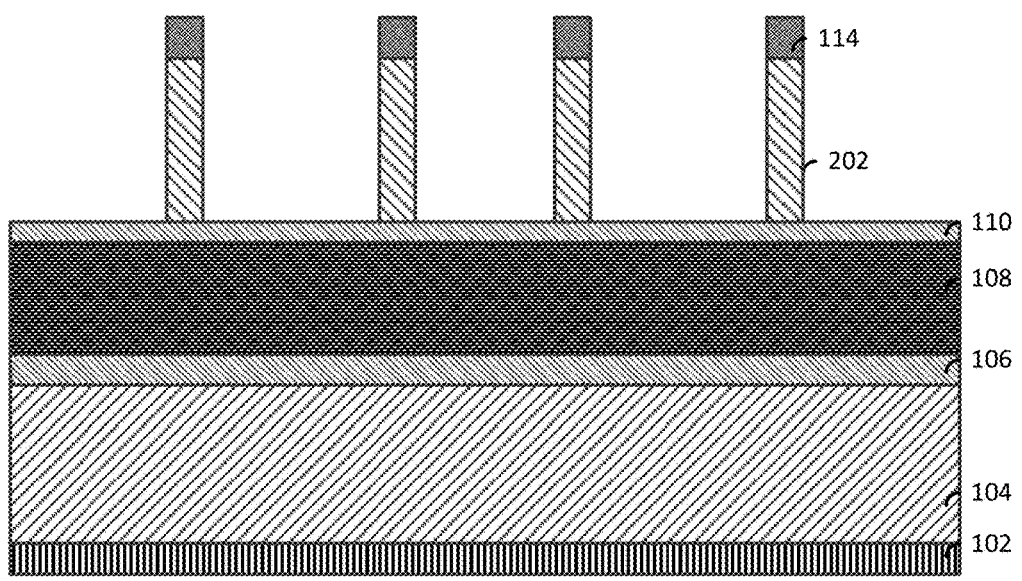

FIG. 2 illustrates a side view following an etching process such as, for example, reactive ion etching that selectively removes exposed portions of the sacrificial mandrel layer 112 to expose portions of the second hardmask 110 and form sacrificial mandrels (mandrel lines) 202. For simplicity and illustrative purposes, the substrate 103, the semiconductor devices 105, and the insulator layer 101 have been omitted from FIG. 2 and subsequent figures.

Figure 3:
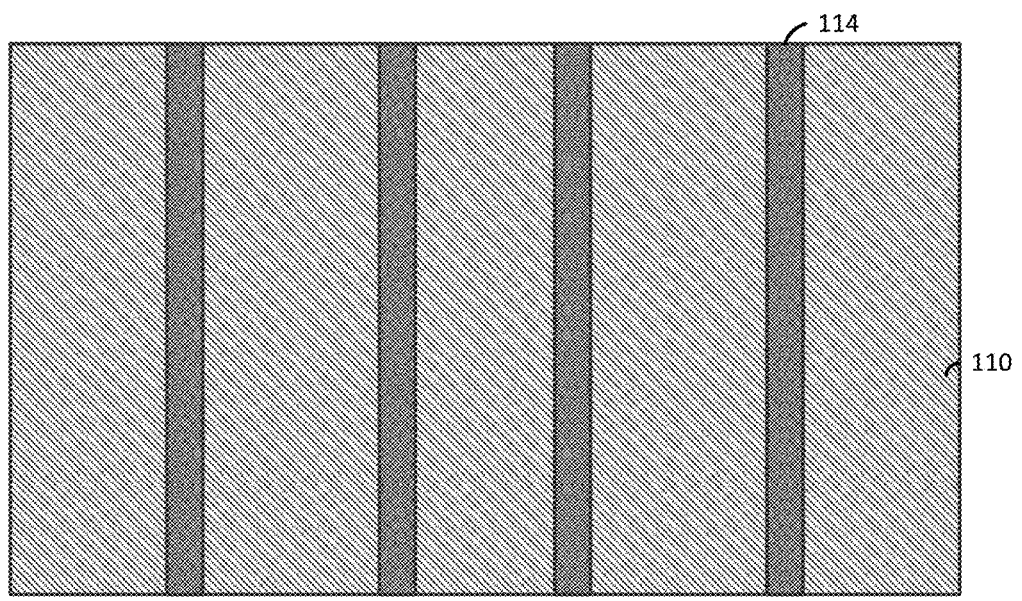

FIG. 3 illustrates a top view of the patterned resist 114 arranged on the second hardmask 110.

Figure 4:
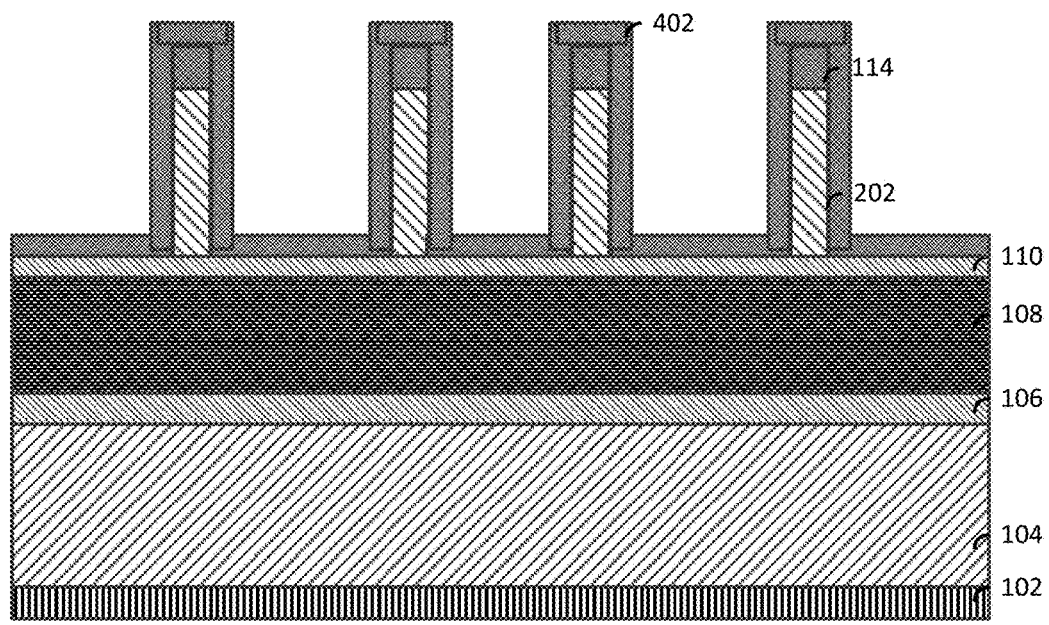

FIG. 4 illustrates a side view following the deposition of a layer of spacer material 402 over exposed portions of the second hardmask 110 and the sacrificial mandrels 202.

Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Figure 5:
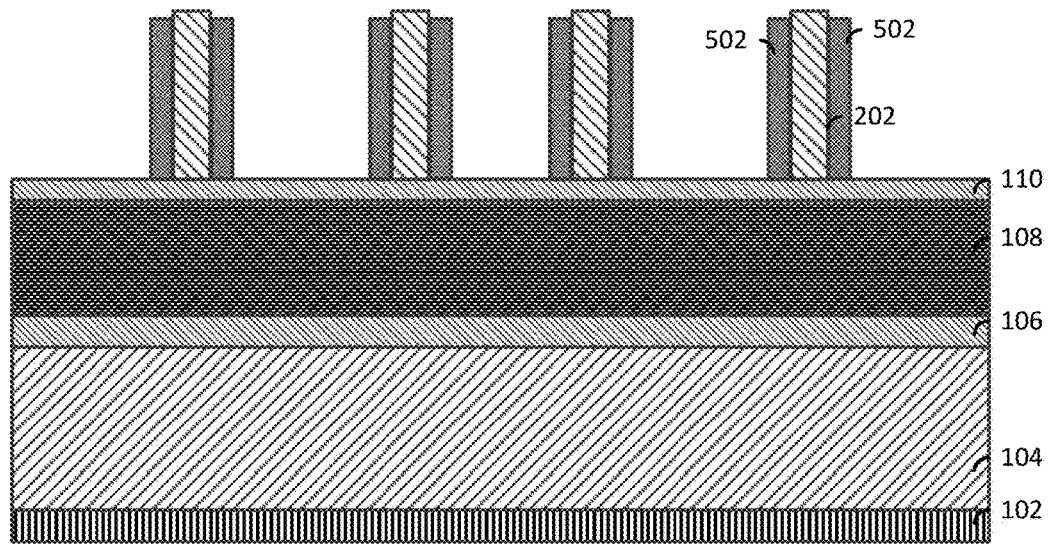

FIG. 5 illustrates a side view following the formation of spacers 502 along sidewalls of the sacrificial mandrels 202. Following the deposition of the layer of spacer material, a suitable anisotropic etching process such as, for example, a reactive ion etching process is performed to remove portions of the layer of spacer material and form the spacers 502.

Figure 6A:
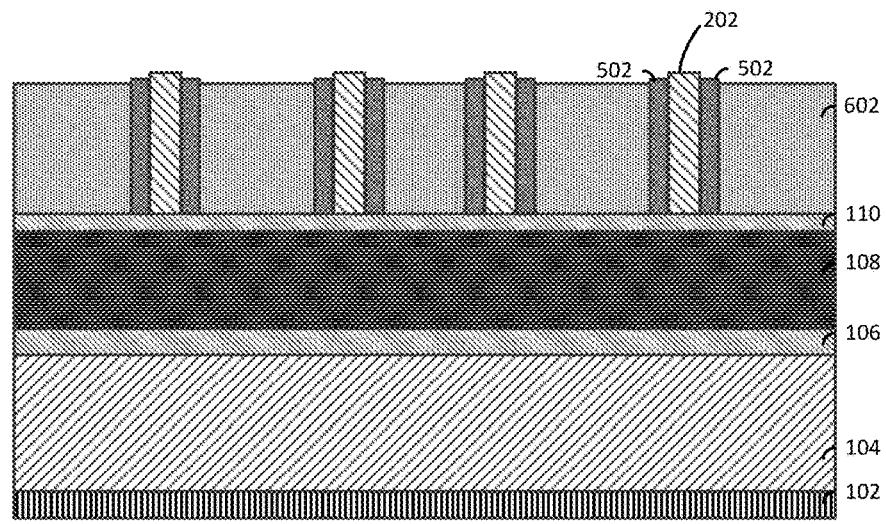
FIG. 6A illustrates a side view following the formation of a non-mandrel lines over exposed portions of the second hardmask.
Figure 6B:
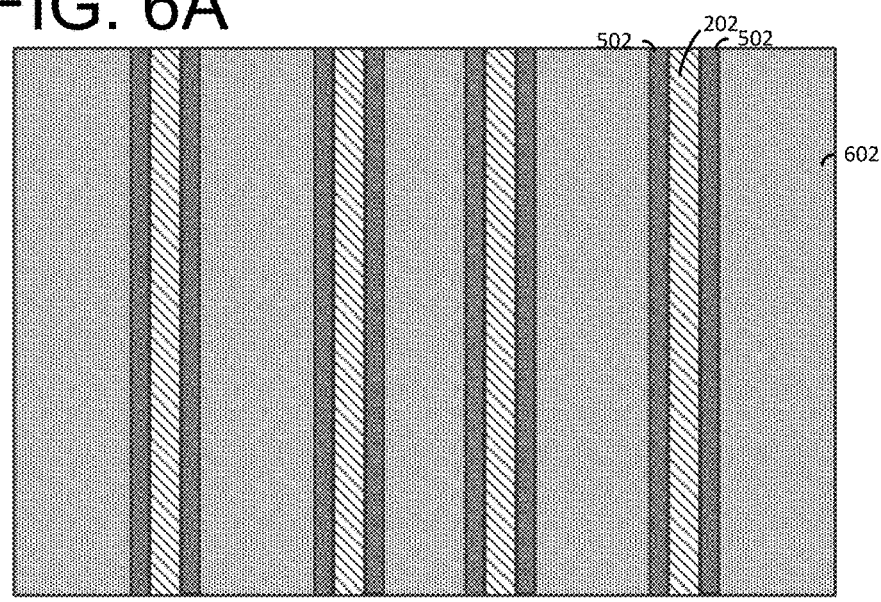
FIG. 6B illustrates a top view of the sacrificial mandrels, the spacers, and the non-mandrel lines.

FIG. 6A illustrates a side view following the formation of a non-mandrel lines 602 over exposed portions of the second hardmask 110. The non-mandrel lines 602 are formed by, for example, depositing a flowable material such as a carbide material over the second hardmask 110 adjacent to the spacers 502. Following the deposition of the non-mandrel line material, an etching or planarization process may be performed to define the non-mandrel lines 602. FIG. 6B illustrates a top view of the sacrificial mandrels 202, the spacers 502, and the non-mandrel lines 602.

Various materials have been discussed above regarding the sacrificial mandrels 202, the spacers 502, and the non-mandrel lines 602 features. In the illustrated exemplary embodiment, the materials used for the sacrificial mandrels 202, the spacers 502 and the non-mandrel lines 602 are dissimilar materials that provide for selective etching such that each of the features may be selectively removed without substantially removing exposed portions of the remaining two features.

Figure 7A:
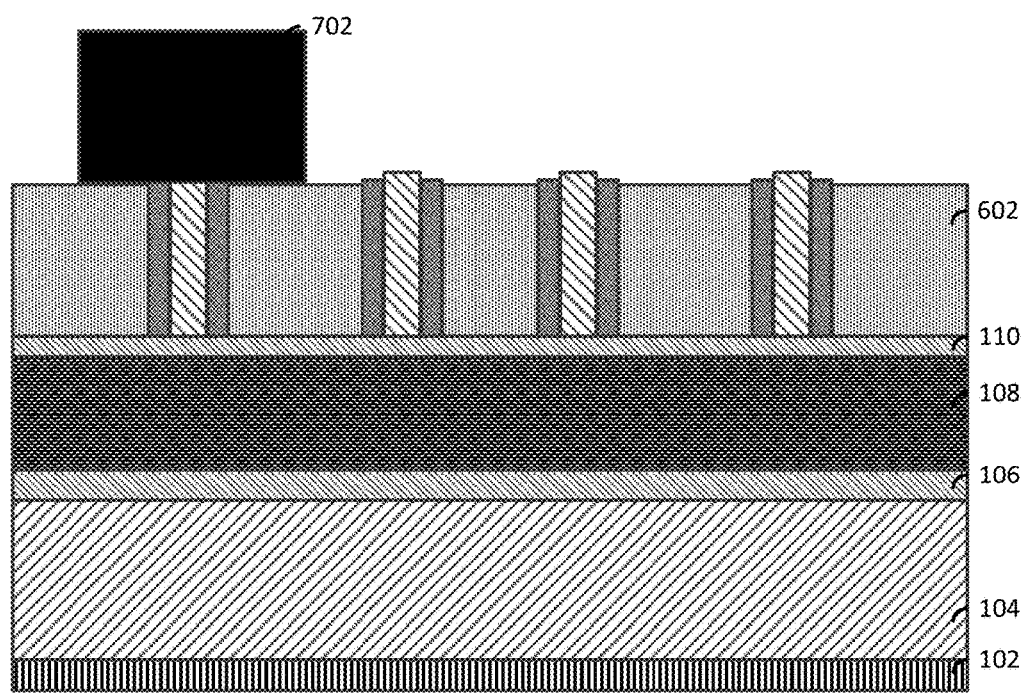
FIG. 7A illustrates a cut-away view along the line A-A (of FIG. 7B) following the formation of a photolithographic mask.
Figure 7B:
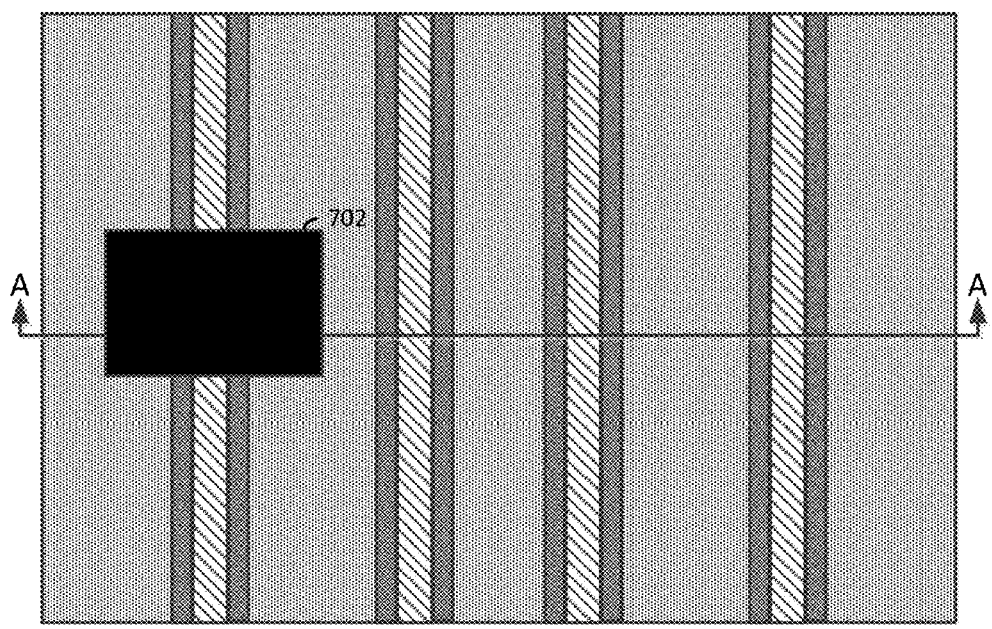
FIG. 7B illustrates a top view of the mask.

FIG. 7A illustrates a cut-away view along the line A-A (of FIG. 7B) following the formation of a photolithographic mask 702 over portions of the sacrificial mandrels 202, the spacers 502, and the non-mandrel lines 602. Suitable masks include photoresists, electron-beam resists, ion-beam resists, X-ray resists, and etch resists. The resist may a polymeric spin on material or a polymeric material. FIG. 7B illustrates a top view of the mask 702.

The mask 702 is arranged to expose a portion of a desired sacrificial mandrel 202. Because the sacrificial mandrel 202 is formed from a material that is dissimilar from the materials used to form the spacers 502 and the non-mandrel lines 602, the alignment of the mask 702 need only mask sacrificial mandrel 202 material that is not intended to be removed in the subsequent etching process (described below). Thus, the mask 702 may be aligned within a margin of error that is substantially equal to the width of the non-mandrel lines 602 and spacers 502 adjacent to the mandrel line 202 that will be subsequently etched.

Figure 8:
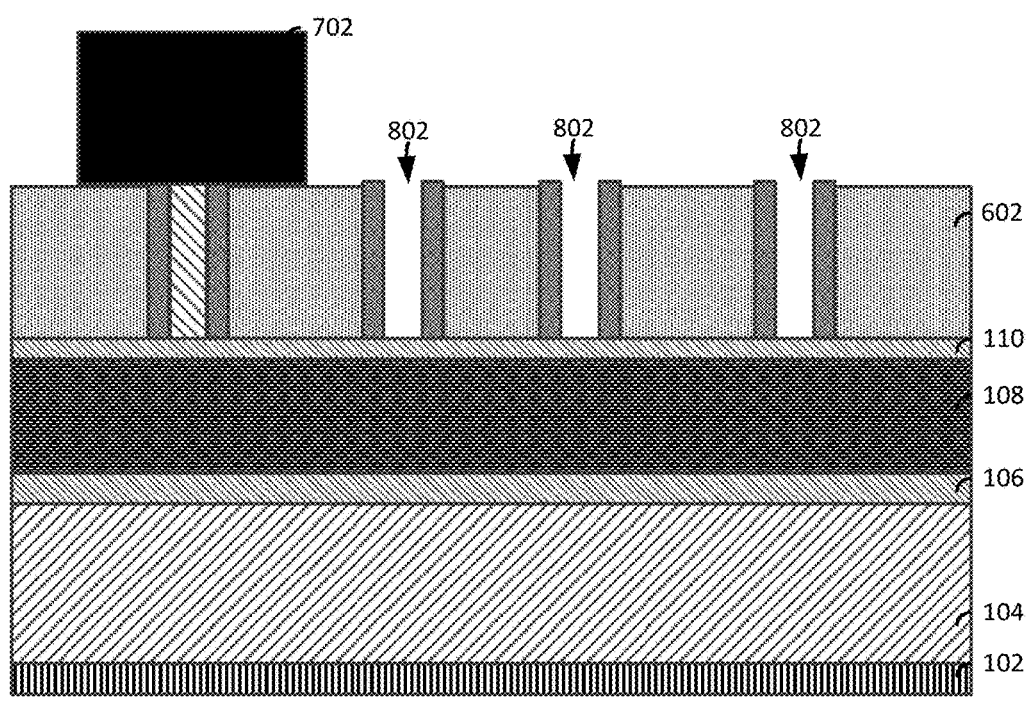

FIG. 8 illustrates a cut-away view following a selective etching process that removes exposed portions of the sacrificial mandrel 202 (of FIG. 7A) and forms a cavity 802. Following the removal of the exposed sacrificial mandrel 202, exposed portions of the underlying second hardmask 110, the organic planarization layer 106 and the first hardmask 106 are removed to expose a portion of the inter-level dielectric layer 104 using an anisotropic etching process.

Figure 9:
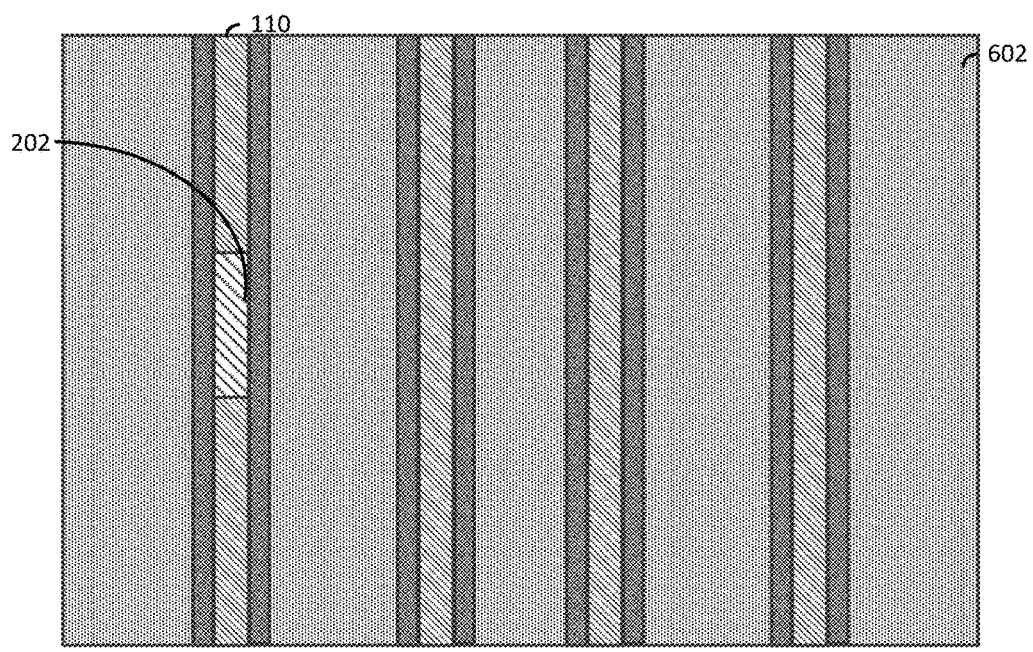

FIG. 9 illustrates a top view of the resultant structure following the removal of the mask 702 (of FIG. 8) using a suitable process such as, for example, ashing. The ashing process may be used to remove a photoresist material, amorphous carbon, or organic planarization (OPL) layer. Ashing is performed using a suitable reaction gas, for example, O2, N2, H2/N2, O3, CF4, or any combination thereof.

Figure 10A:
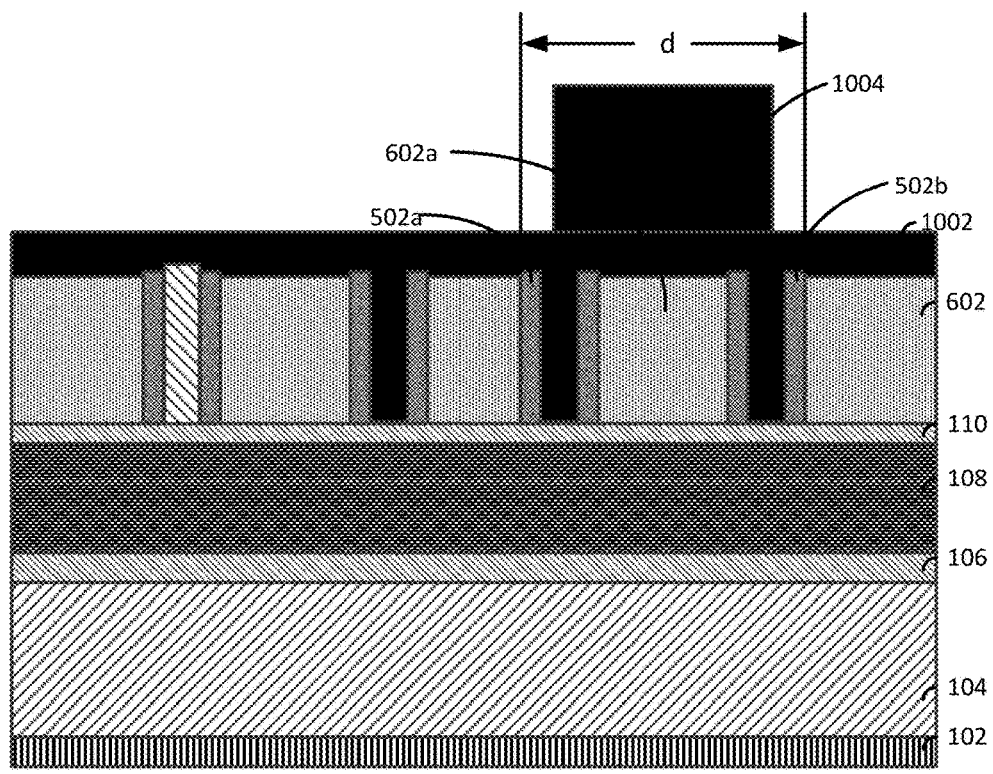
FIG. 10A illustrates a cut-away view following the deposition of a mask that fills the cavities.

FIG. 10A illustrates a cut-away view following the deposition of a mask 1002 that fills the cavities 802 (of FIG. 8). The mask 1002 includes a pillar resist portion 1004 that is arranged over a portion of the non-mandrel line 602a.

Figure 10B:
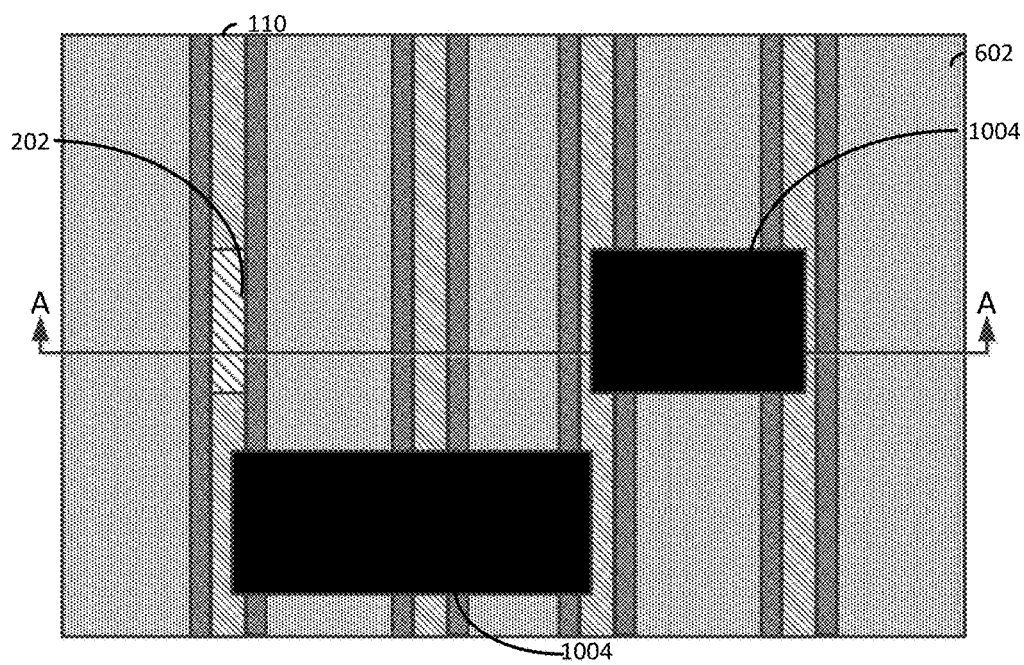
FIG. 10B illustrates a top view of the pillar resist, where a portion of the mask has not been shown for clarity.

The pillar resist portion 1004 is arranged to mask a portion of a desired non-mandrel line 602a. Because the non-mandrel line 602a is formed from a material that is dissimilar from the materials used to form the spacers 502 and the sacrificial mandrel lines 202, the alignment of the pillar resist 1004 need only mask a portion of the non-mandrel line 602a material that is not intended to be removed in the subsequent etching process (described below). Thus, the pillar resist 1004 may be aligned within a region having a margin of error that is substantially equal to the width (d) of the sacrificial mandrels 202 and spacers 502 adjacent to the non-mandrel line 602a that will be subsequently etched. FIG. 10B illustrates a top view of the pillar resist 1004, where a portion of the mask 1002 has not been shown for clarity.

Figure 11A:
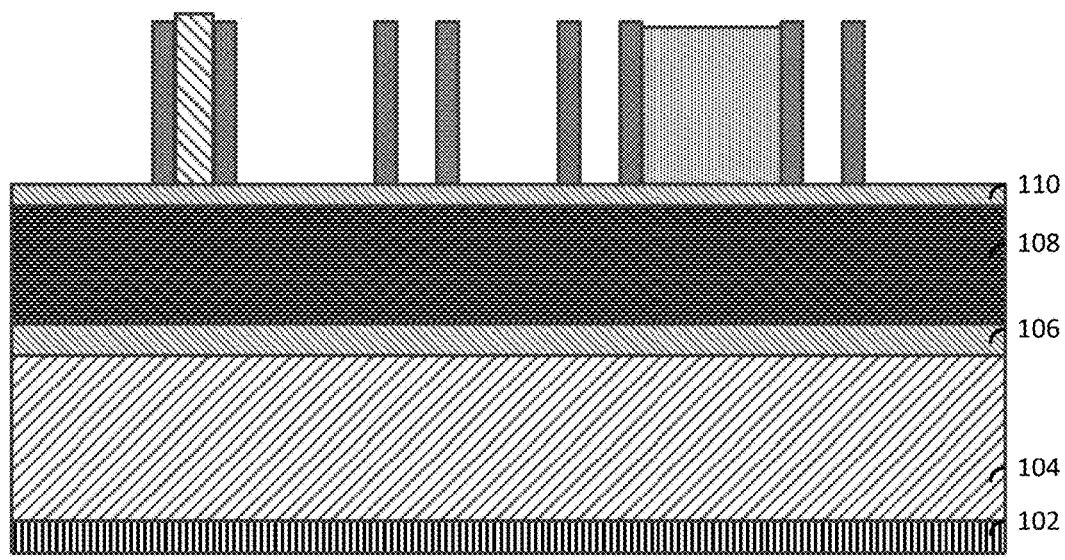
FIG. 11A illustrates a cut-away view along the line A-A (of FIG. 11B) following a selective etching process.
Figure 11B:
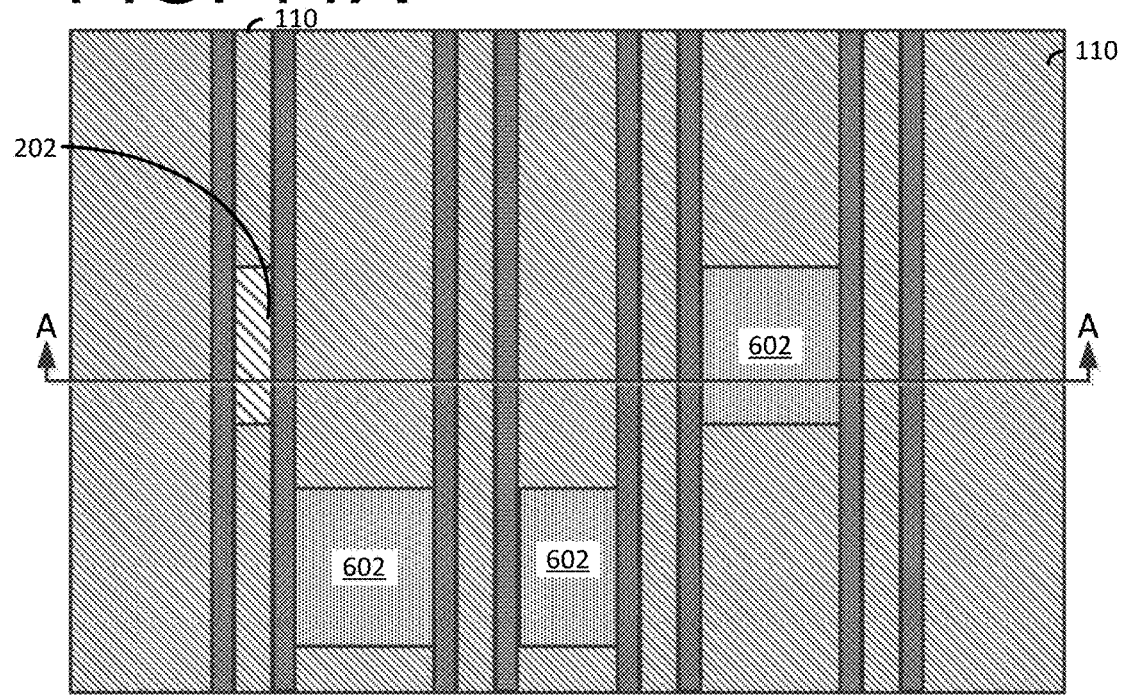
FIG. 11B illustrates a top view following the selective etching process described above.

FIG. 11A illustrates a cut-away view along the line A-A (of FIG. 11B) following a selective etching process that removes exposed portions of the mask 1002 material and the non-mandrel lines 602 (of FIG. 10A). FIG. 11B illustrates a top view following the selective etching process described above.

Figure 12:
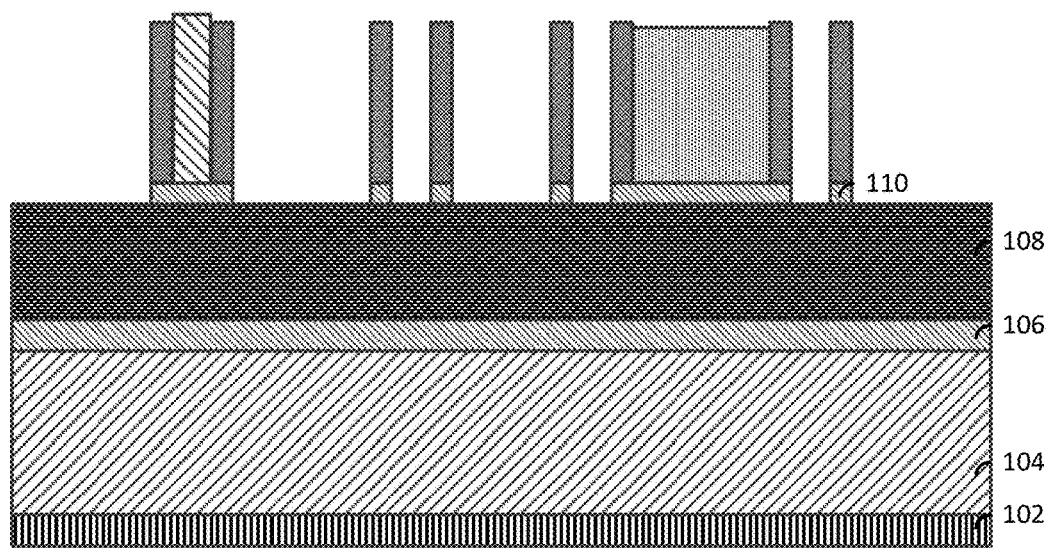

FIG. 12 illustrates a cut-away view following a selective etching process that removes exposed portions of the underlying second hardmask 110 to expose a portion of the organic planarization layer 108 using an anisotropic etching process.

Figure 13:
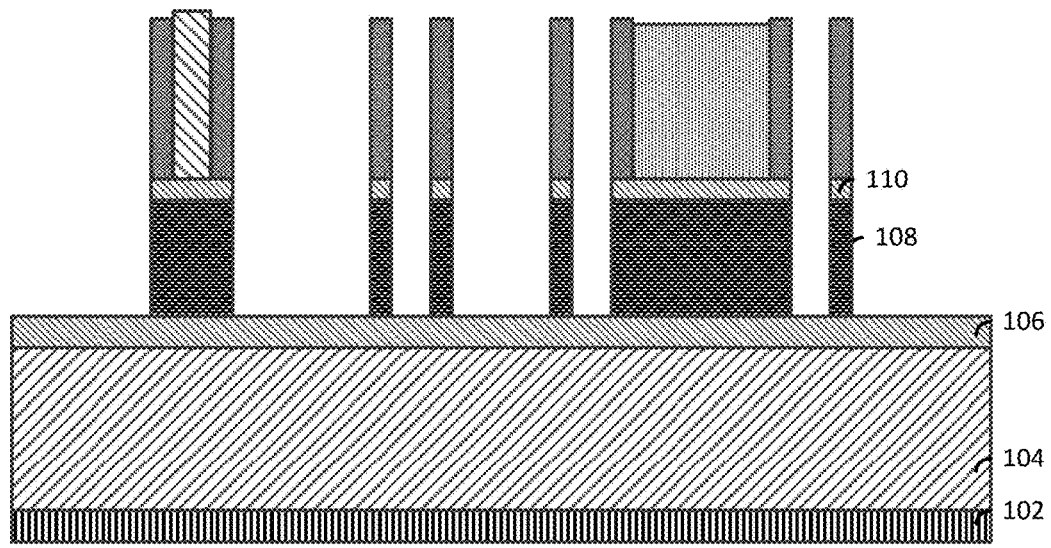

FIG. 13 illustrates a cut-away view following a selective anisotropic etching process that removes exposed portions of the organic planarization layer 108 to expose portions of the first hardmask 106.

Figure 14:
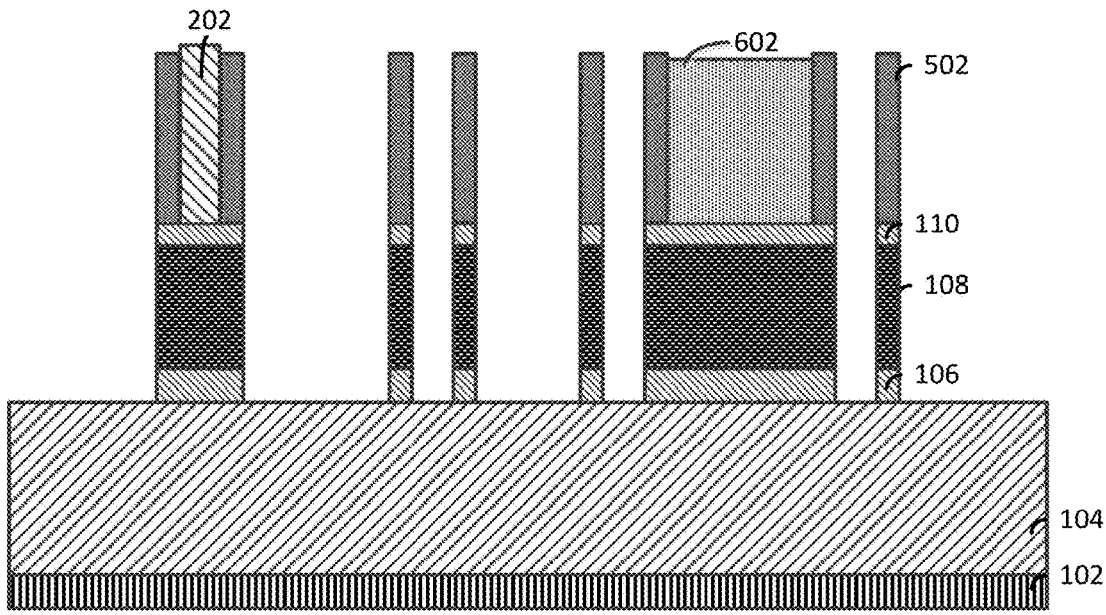

FIG. 14 illustrates a cut-away view following another selective anisotropic etching process that removes exposed portions of the first hardmask 106 to expose portions of the inter-level dielectric layer 104.

Figure 15:
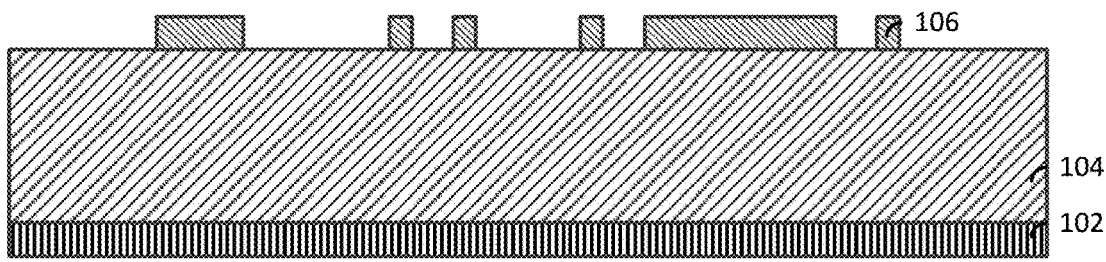

FIG. 15 illustrates a cut-away view of the resultant structure following the removal of the organic planarization layer 108, the second hardmask 110, the spacers 502, the non-mandrel line 602, and the sacrificial mandrel 202 (of FIG. 14.)

Figure 16:
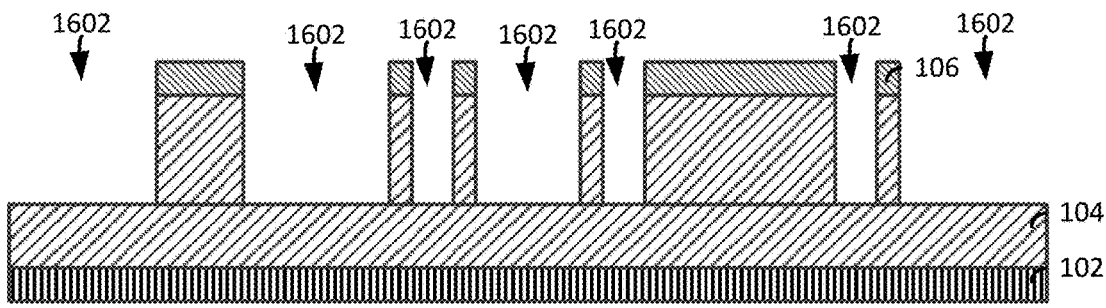

FIG. 16 illustrates a cut-away view following a selective etching process such as, for example, reactive ion etching. The etching process forms cavities (trenches) 1602 by removing exposed portions of the inter-level dielectric layer 104.

Figure 17:
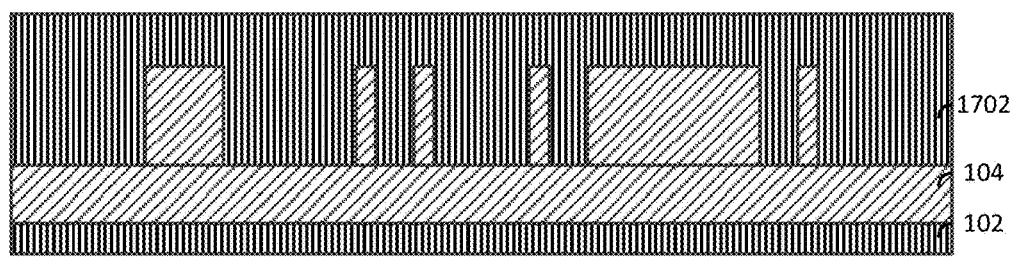

FIG. 17 illustrates a cut-away view following the deposition of a conductive material 1702 such as, for example, copper, silver, gold, aluminum, or another conductive material into the trenches 1602.

Figure 18A:
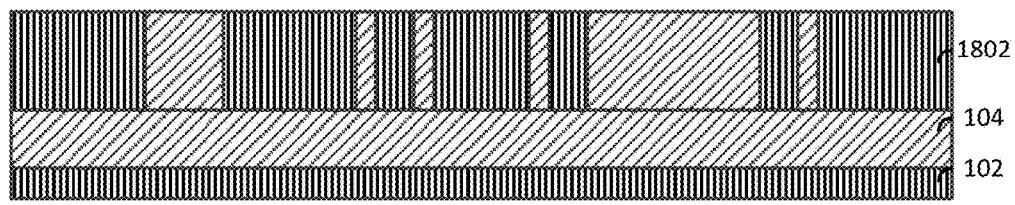
FIG. 18A illustrates a cut-away view along the line A-A (of FIG. 18B) following a planarization process.
Figure 18B:
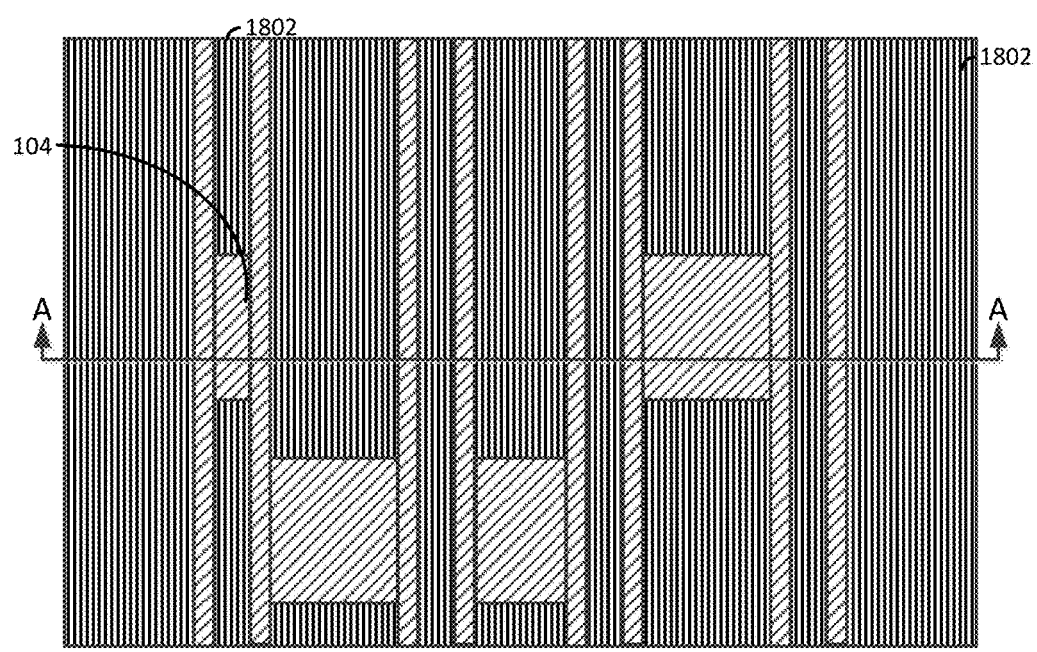
FIG. 18B illustrates a top view of the resultant structure following the formation of the conductive lines.

FIG. 18A illustrates a cut-away view along the line A-A (of FIG. 18B) following a planarization process. The planarization process such as, for example, chemical mechanical polishing may be performed to remove overburden material and form conductive lines 1802. Prior to depositing the conductive material, a liner layer (not shown) may be formed. FIG. 18B illustrates a top view of the resultant structure following the formation of the conductive lines 1802.

FIGS. 19-38B illustrate another exemplary embodiment of a method for forming conductive lines for a semiconductor device.

Figure 19:
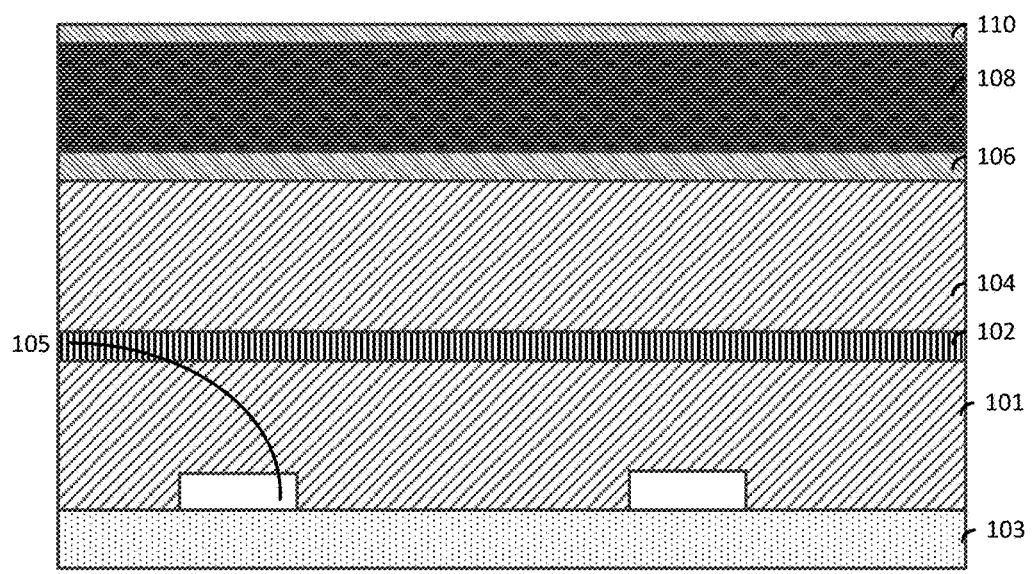

FIG. 19 illustrates a side view of a structure formed on a substrate 103 that is similar to the structure described above in FIG. 1. Semiconductor devices 105 are arranged on the substrate 103, a layer of insulating material 101 is arranged on the semiconductor devices 105 and the substrate 103. A conductive line 102 is arranged on the layer of insulating material 101. An inter-level dielectric layer (insulator layer) 104 is arranged on the conductive line 102. A first hardmask 106 is arranged on the inter-level dielectric layer 104. An organic planarization layer 108 is arranged on the first hardmask 106 and a second hardmask 110 is arranged on the organic planarization layer 108.

Figure 20A:
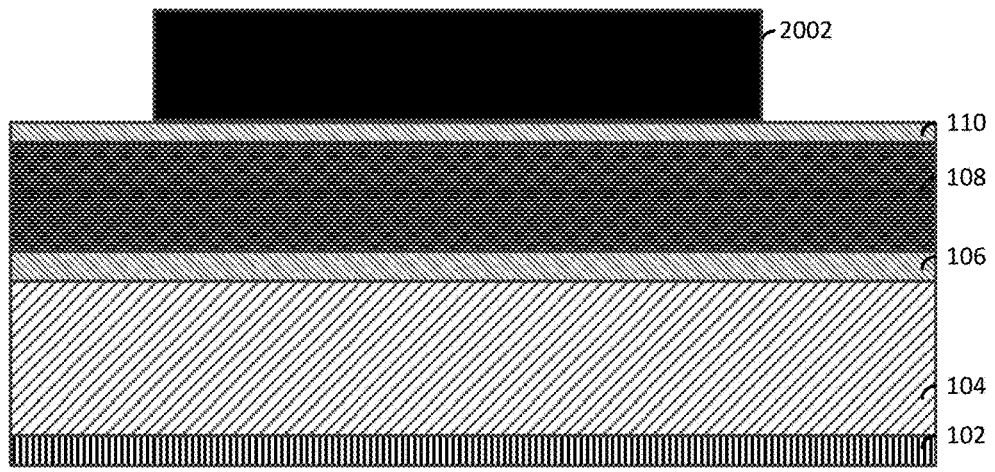
FIG. 20A illustrates a cut-away view along the line A-A (of FIG. 20B) view following the patterning and deposition of a mask.
Figure 20B:
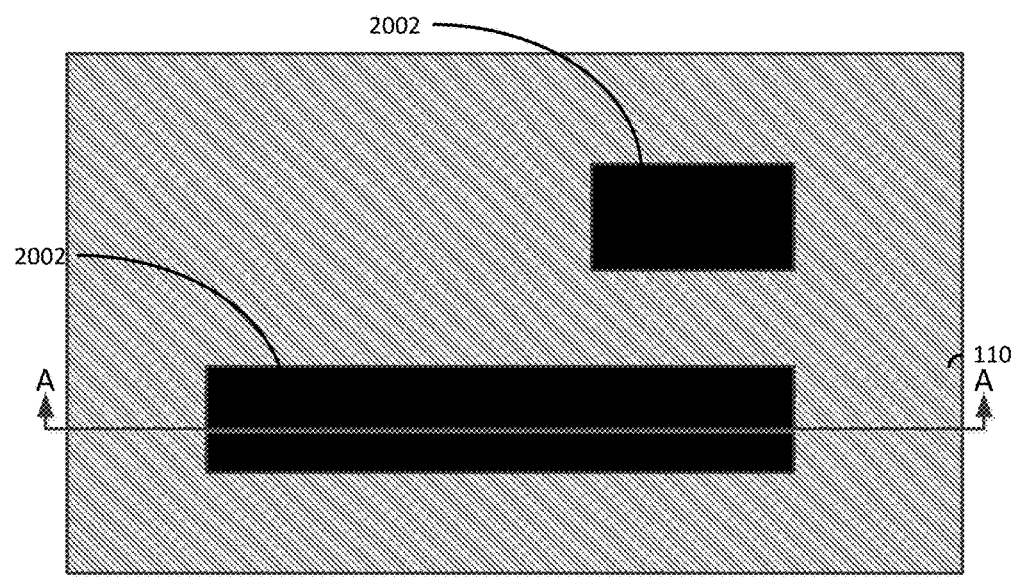
FIG. 20B illustrates a top view of the mask.

FIG. 20A illustrates a cut-away view along the line A-A (of FIG. 20B) view following the patterning and deposition of a mask 2002 over portions of the second hardmask 110. For simplicity and illustrative purposes, the substrate 103, the semiconductor devices 105, and the insulator layer 101 have been omitted from FIG. 2 and subsequent figures. FIG. 20B illustrates a top view of the mask 2002.

Figure 21A:
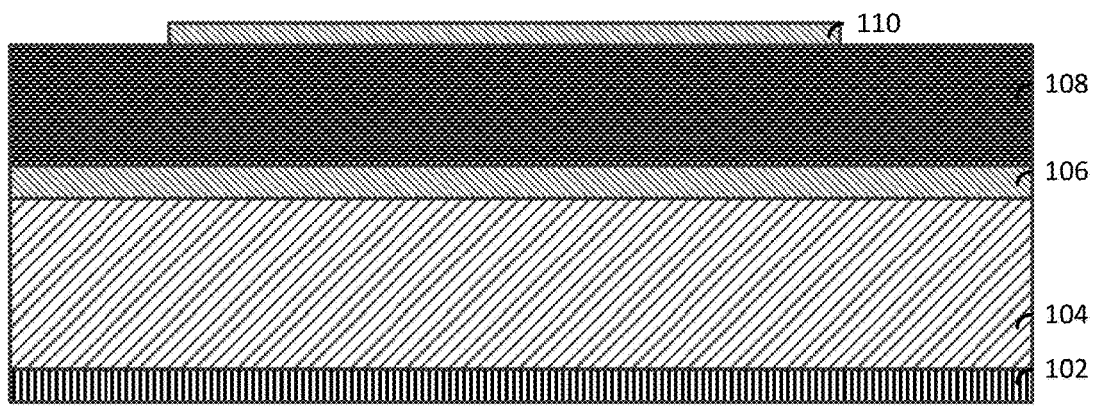
FIG. 21A illustrates a cut-away view along the line A-A (of FIG. 21B) following an anisotropic etching process.
Figure 21B:
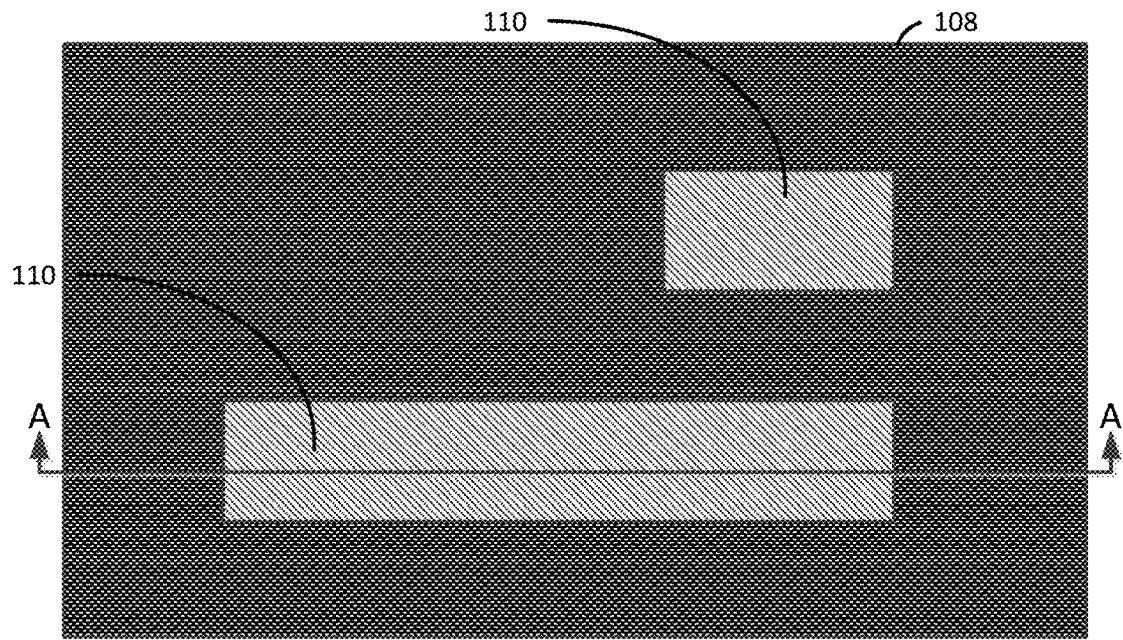
FIG. 21B illustrates a top view of the second hardmask arranged on the organic planarization layer.

FIG. 21A illustrates a cut-away view along the line A-A (of FIG. 21B) following an anisotropic etching process. The anisotropic etching process, such as, for example, reactive ion etching, removes exposed portions of the second hardmask 110 to expose portions of the organic planarization layer 108. FIG. 21B illustrates a top view of the second hardmask 110 arranged on the organic planarization layer 108.

Figure 22:
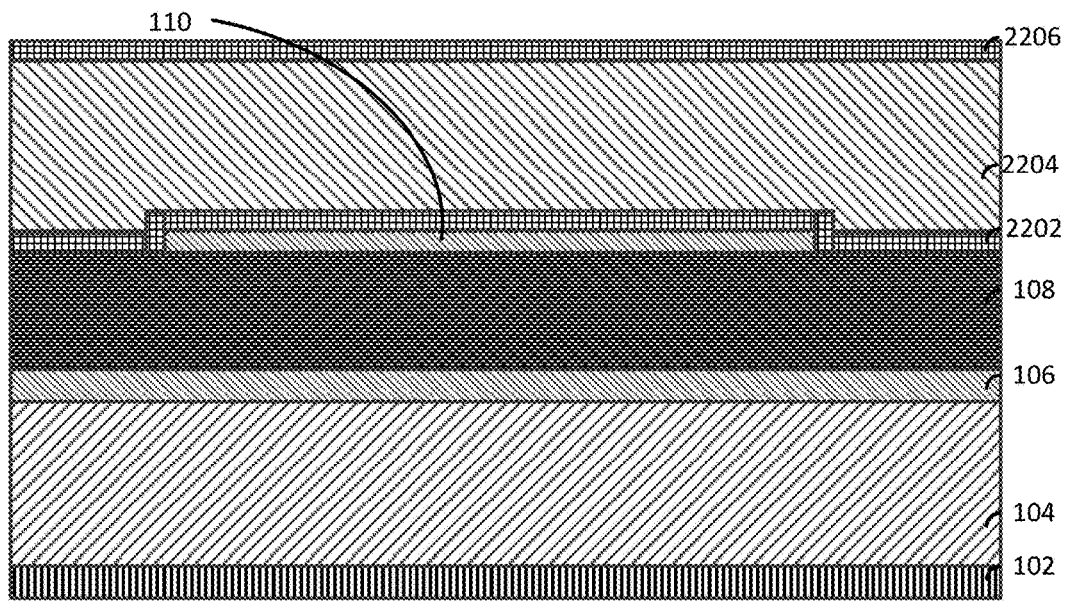

FIG. 22 illustrates a cut-away view following the deposition of a third hardmask 2202 over exposed portions of the organic planarizing layer 108 and the second hardmask 110. The third hardmask 2202 in the illustrated embodiment includes an oxide material. Other exemplary embodiments may include other suitable materials such as, for example, a nitride material. A sacrificial mandrel material 2204 is deposited over the third hardmask 2202 followed by a fourth hardmask 2206 that is deposited over the sacrificial mandrel material 2204. The sacrificial mandrel material 2204 may include, for example, an amorphous carbon or amorphous silicon material.

Figure 23A:
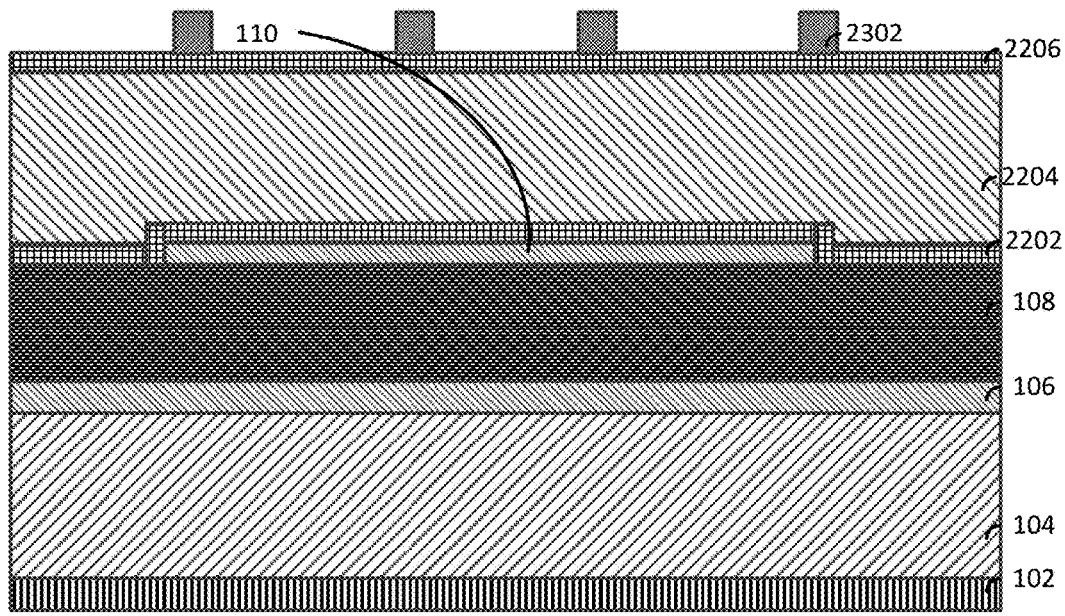
FIG. 23A illustrates a cut-away view along the line A-A (of FIG. 23B) following the patterning and deposition of a photolithographic resist.
Figure 23B:
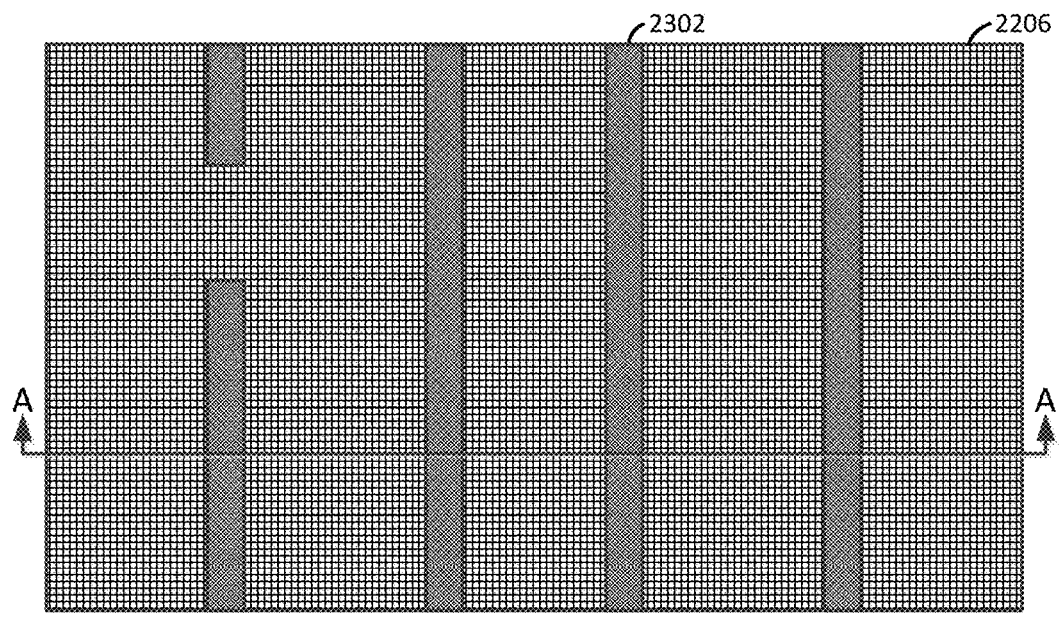
FIG. 23B illustrates a top view of the resist arranged on the fourth hardmask.

FIG. 23A illustrates a cut-away view along the line A-A (of FIG. 23B) following the patterning and deposition of a photolithographic resist 2302 over portions of the fourth hardmask 2206. FIG. 23B illustrates a top view of the resist 2302 arranged on the fourth hardmask 2206.

Figure 24:
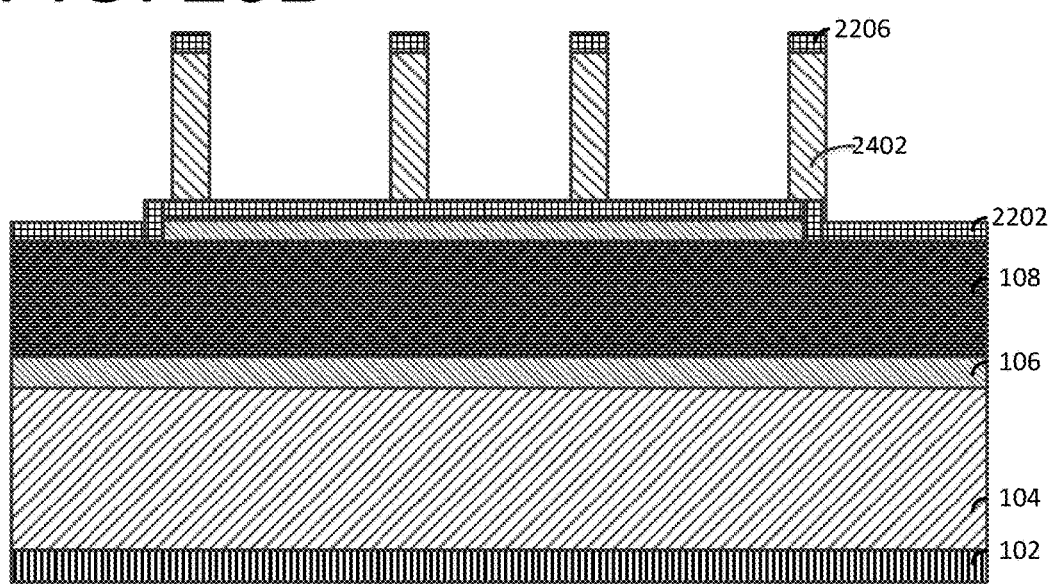

FIG. 24 illustrates a cut-away view of the resultant structure following a selective etching process. The etching process is an anisotropic etching process, such as for example, reactive ion etching that removes exposed portions of the sacrificial mandrel layer 2204 (of FIG. 23A) to expose portions of the third hardmask 2202 and form sacrificial mandrels 2402 on the third hardmask 2202.

Figure 25:
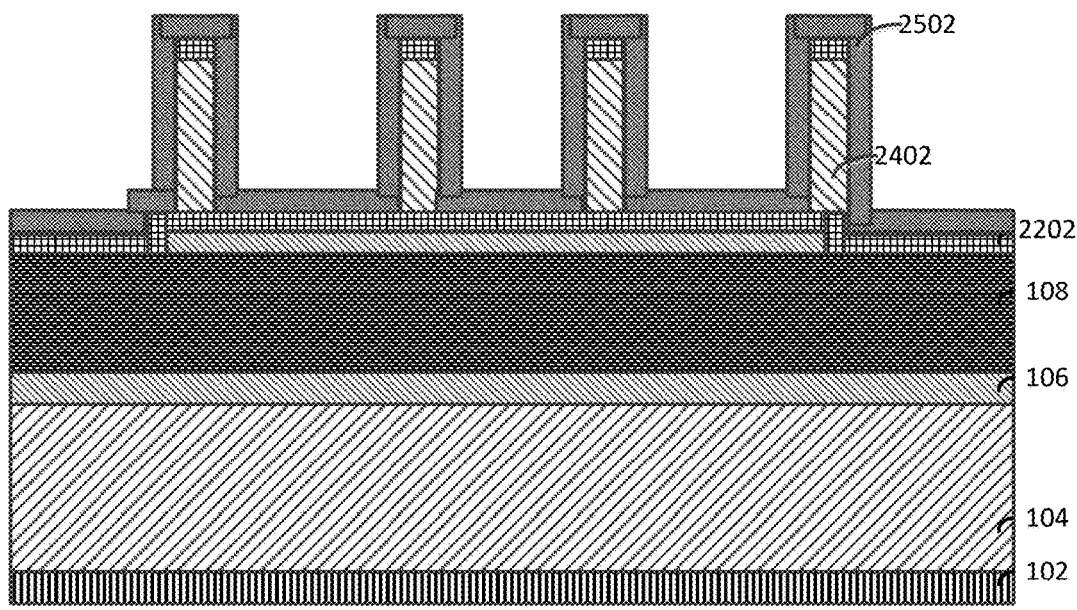

FIG. 25 illustrates a cut-away view following the deposition of a layer of spacer material 2502 over the exposed portions of the third hardmask 2202 and the sacrificial mandrels 2402. The layer of spacer material 2502 may include, for example, a nitride or an oxide material.

Figure 26:
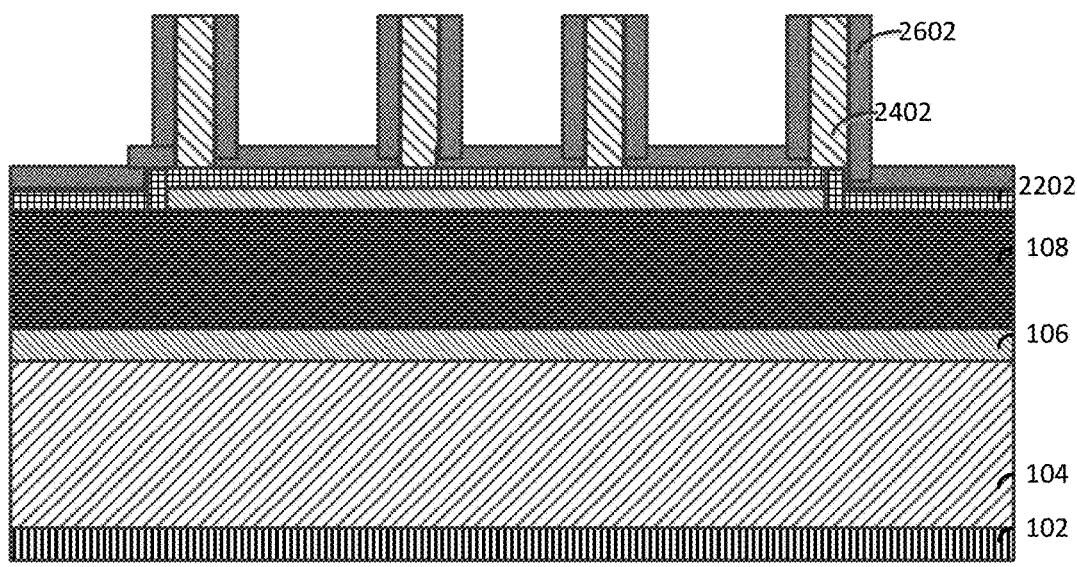

FIG. 26 illustrates a cut-away view following an anisotropic etching process such as, for example, reactive ion etching. The etching process removes portions of the layer of spacer material 2502 to form spacers 2602 along sidewalls of the sacrificial mandrels 2402.

Figure 27:
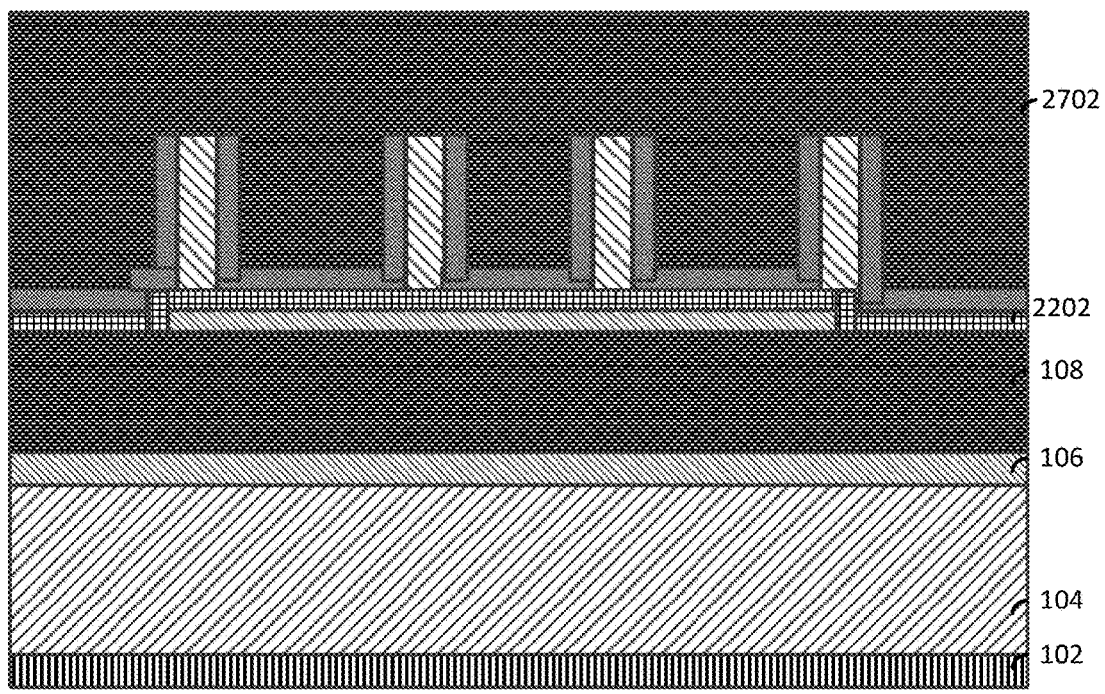

FIG. 27 illustrates a cut-away view following the deposition of a second organic planarization layer 2702 over exposed portions of the sacrificial mandrels 2402 and the spacers 2602.

Figure 28:
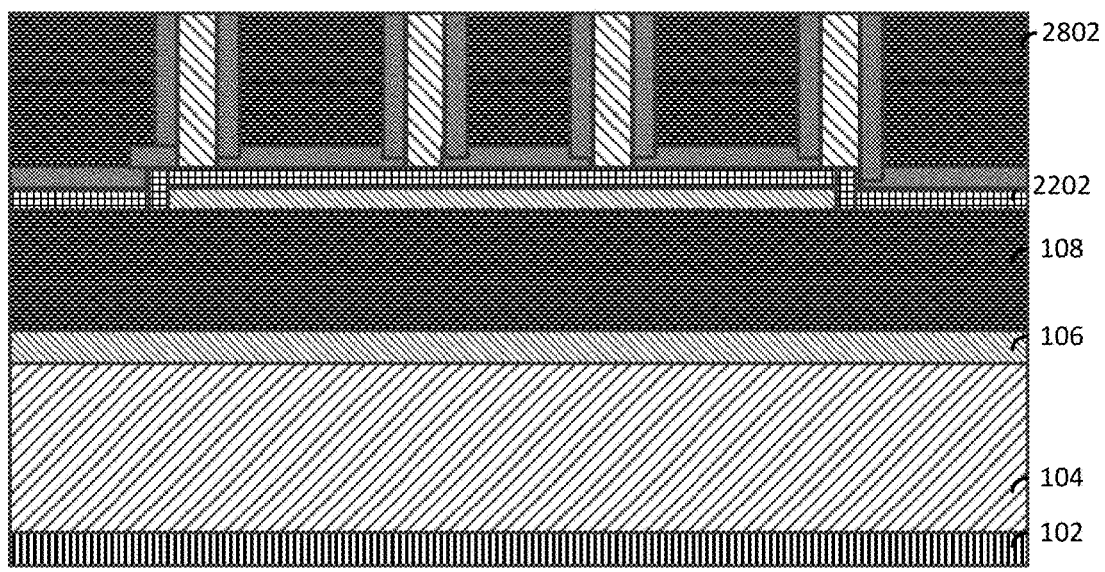

FIG. 28 illustrates a cut-away view following an etching or planarization process that removes portions of the second organic planarization layer 2702 to form non-mandrel lines 2802.

Figure 29A:
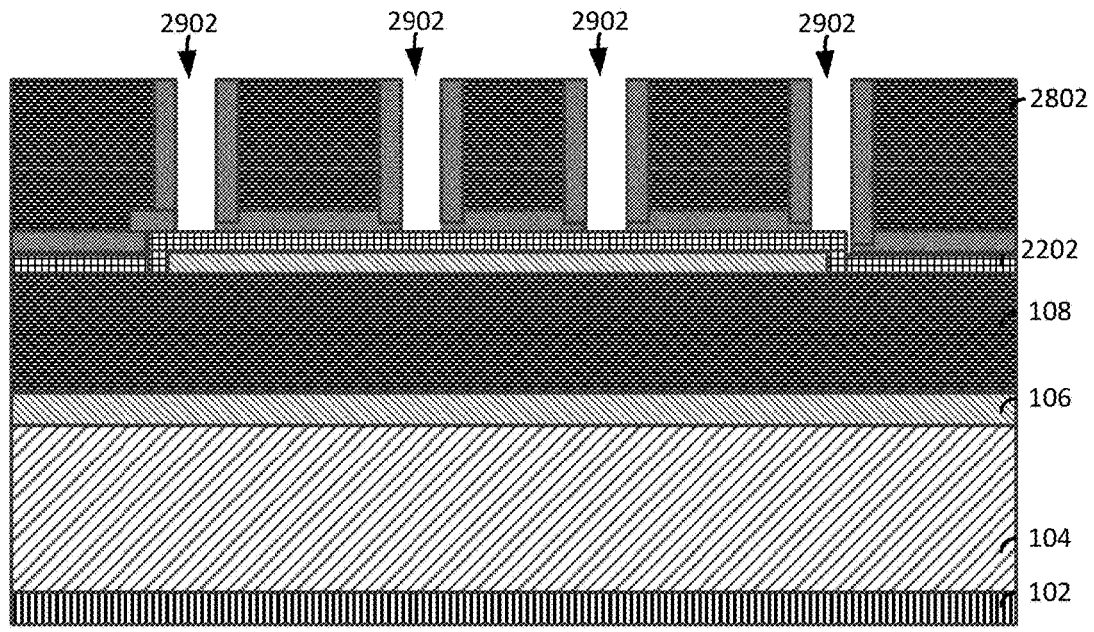
FIG. 29A illustrates a cut-away view along the line A-A (of FIG. 29C) following a selective etching process that removes exposed portions of the sacrificial mandrels.
Figure 29B:
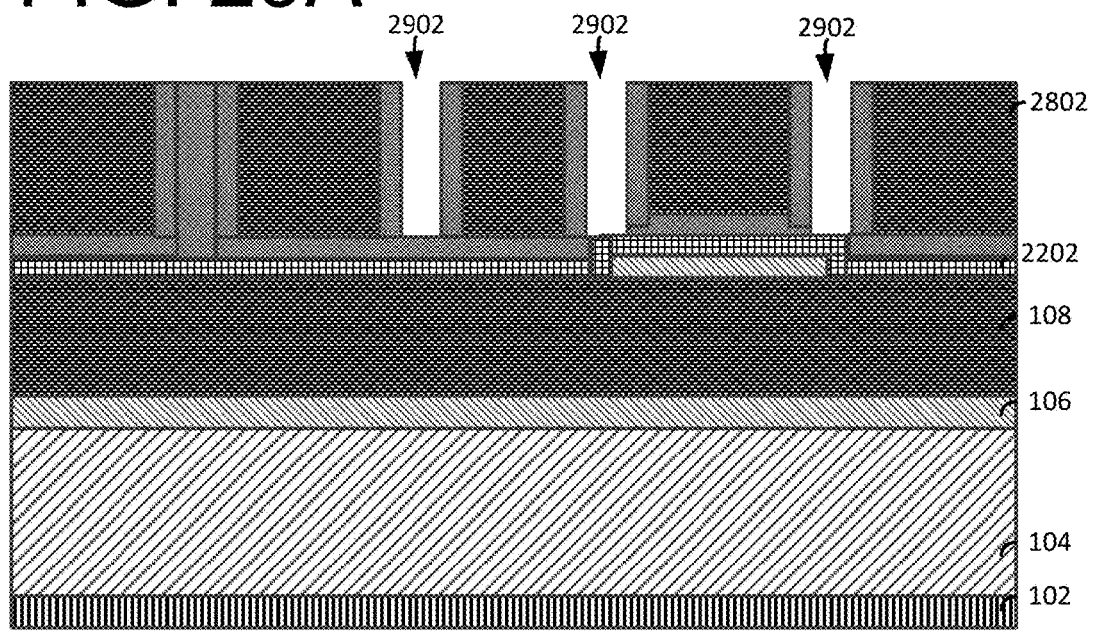
FIG. 29B illustrates a cut-away view along the line B-B (of FIG. 29C) of the cavities.
Figure 29C:
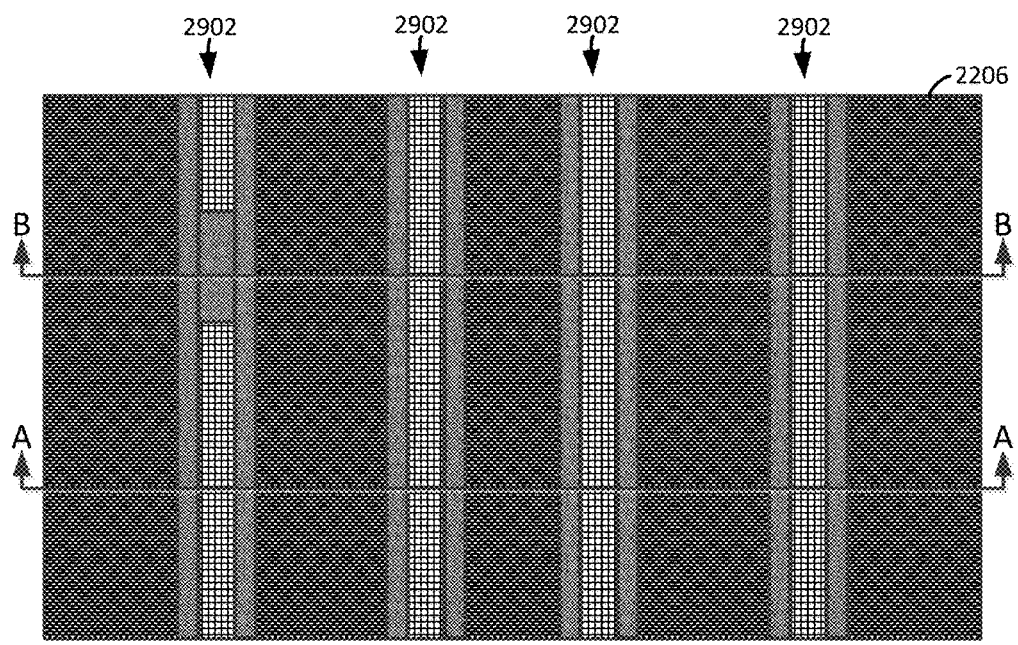
FIG. 29C illustrates a top view of the cavities.

FIG. 29A illustrates a cut-away view along the line A-A (of FIG. 29C) following a selective etching process that removes exposed portions of the sacrificial mandrels 2404 (of FIG. 28) to form cavities 2902. FIG. 29B illustrates a cut-away view along the line B-B (of FIG. 29C) of the cavities 2902. FIG. 29C illustrates a top view of the cavities 2902.

Figure 30:
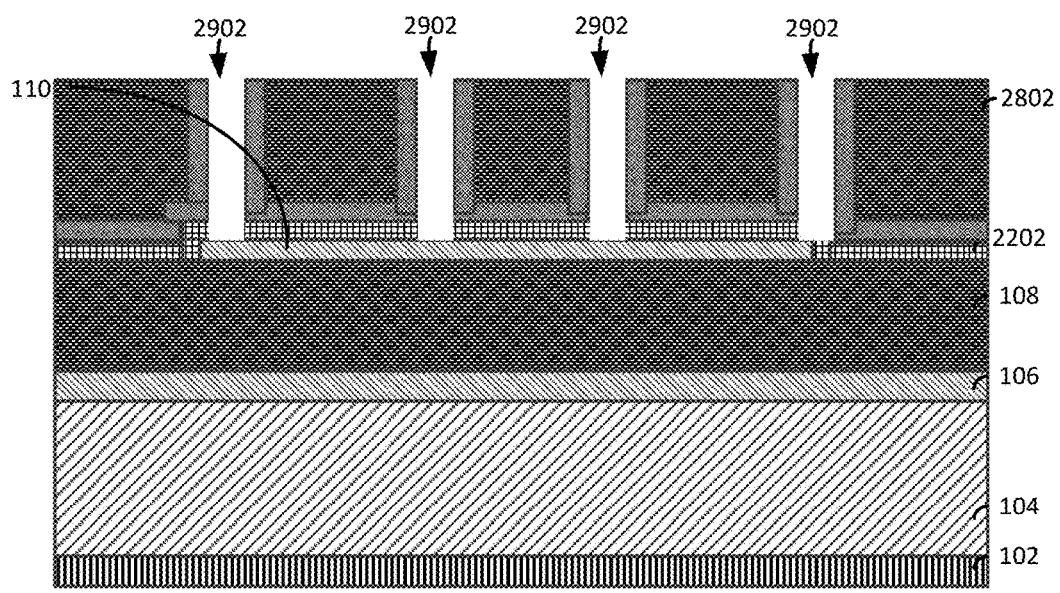

FIG. 30 illustrates a cut-away view following a selective anisotropic etching process such as, for example, reactive ion etching. The etching process removes exposed portions of the third hardmask 2202 in the cavities 2902 to increase the depth of the cavities 2902 and expose portions of the second hardmask 110.

Figure 31:
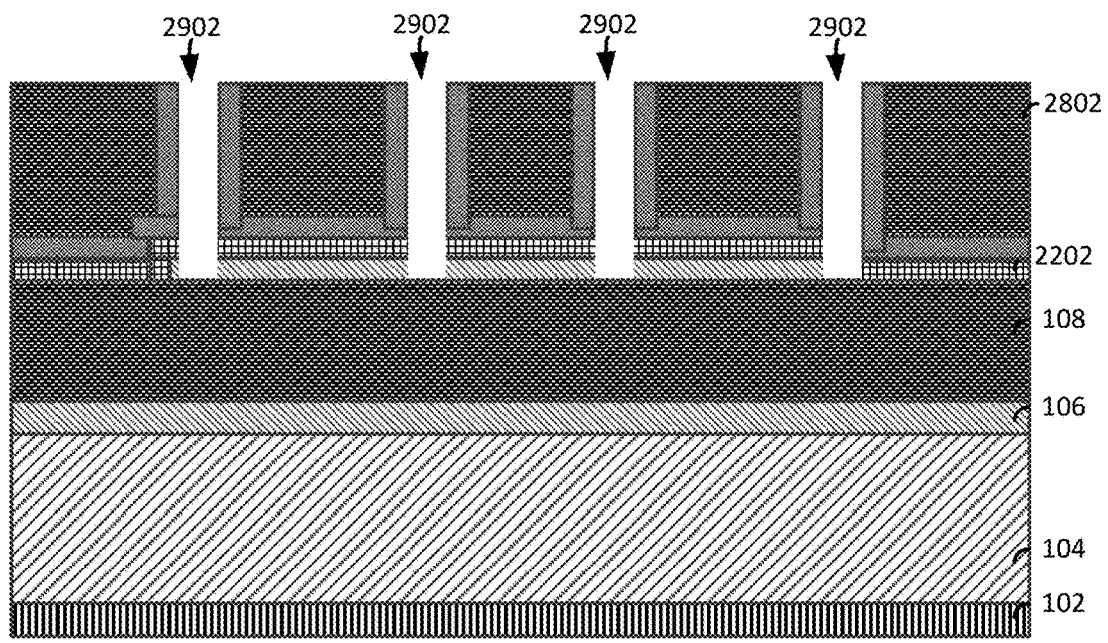

FIG. 31 illustrates a cut-away view following a selective anisotropic etching process such as, for example, reactive ion etching. The etching process removes exposed portions of the second hardmask 110 in the cavities 2902 to increase the depth of the cavities 2902 and expose portions of the organic planarization layer 108.

Figure 32:
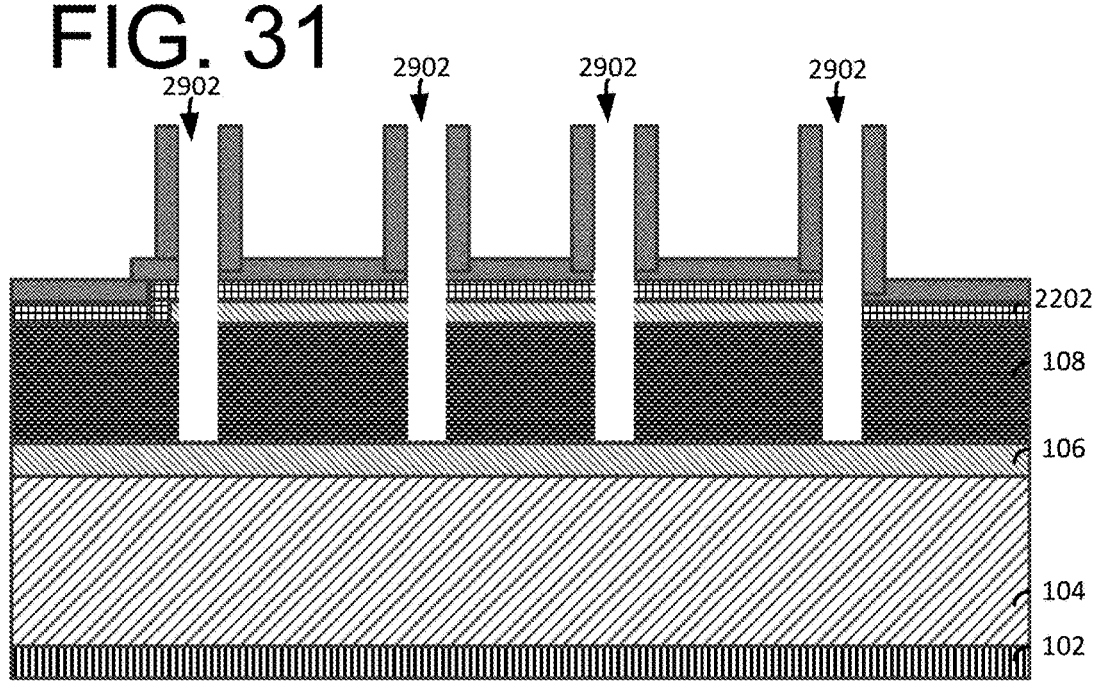

FIG. 32 illustrates a cut-away view following another selective anisotropic etching process such as, for example, reactive ion etching. The etching process removes exposed portions of the organic planarization layer 108 to increase the depth of the cavities 2902 and expose portions of the first hardmask 106. During the etching process the exposed portions of the non-mandrel lines 2802 (of FIG. 31) are removed.

Figure 33:
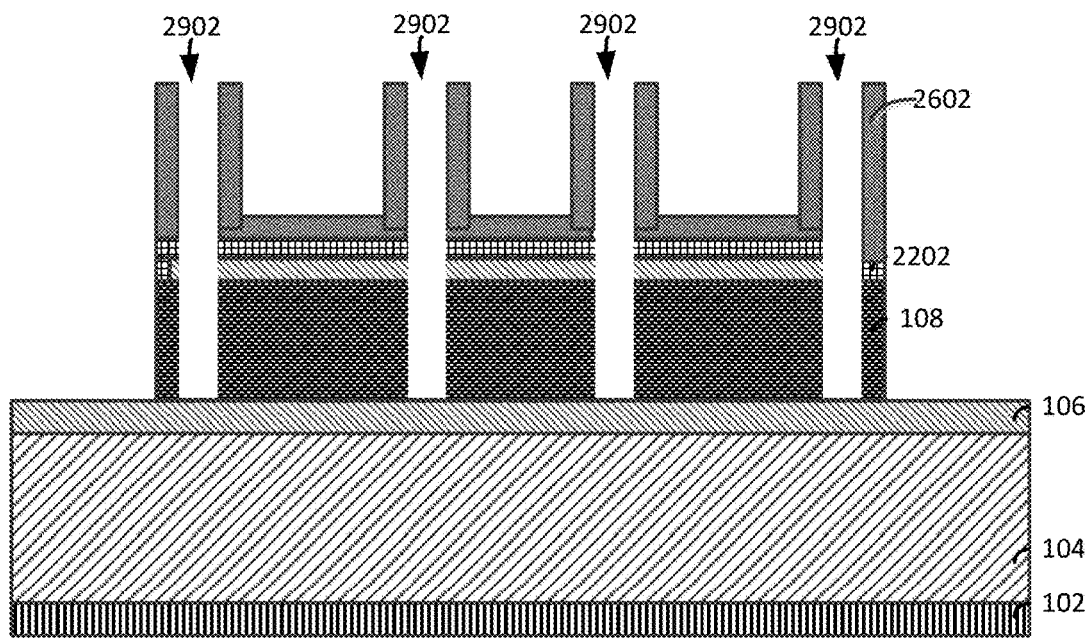

FIG. 33 illustrates a cut-away view following another anisotropic etching process that removes non-obscured regions of the organic planarizing layer 108 to further expose portions of the first hardmask 106.

Figure 34A:
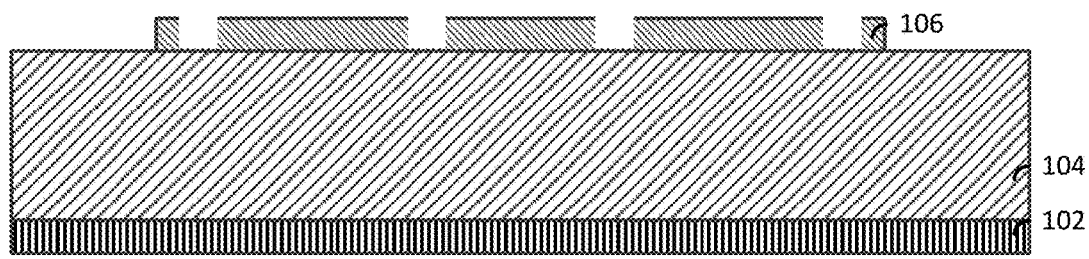
FIG. 34A illustrates a cut-away view along the line A-A (of FIG. 34B) of the resultant structure following an anisotropic etching process that removes exposed portions of the first hardmask.
Figure 34B:
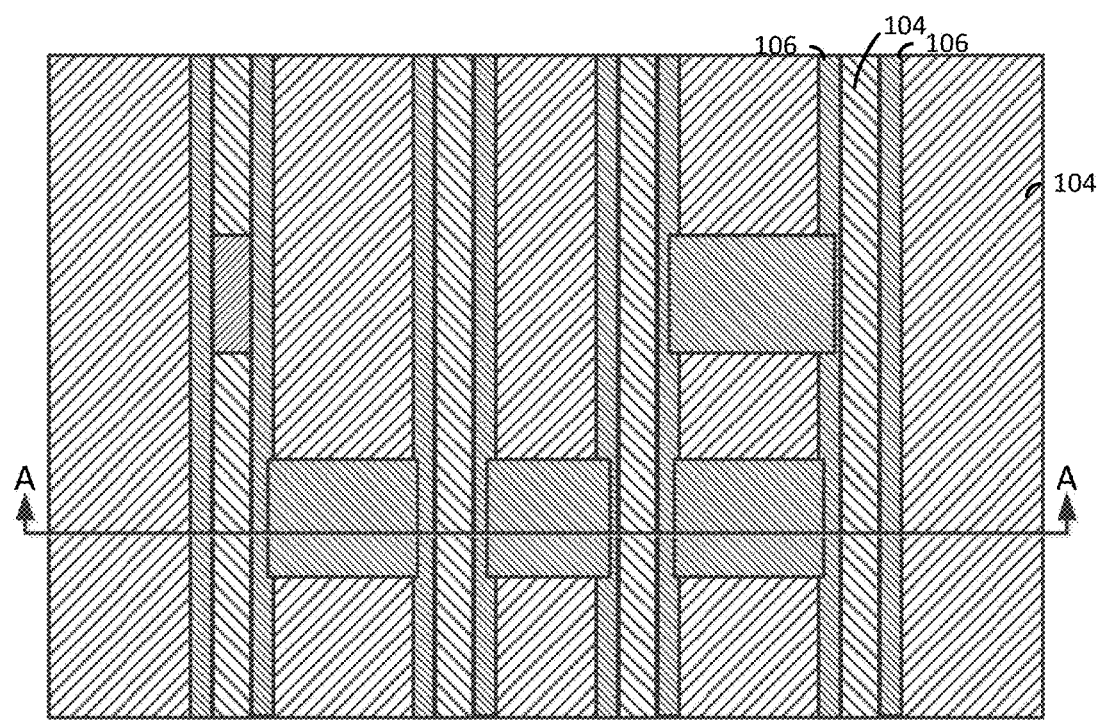
FIG. 34B illustrates a top view of the first hardmask arranged on the inter-level dielectric layer.

FIG. 34A illustrates a cut-away view along the line A-A (of FIG. 34B) of the resultant structure following an anisotropic etching process that removes exposed portions of the first hardmask 106. Following the removal of portions of the first hardmask 106, the remnants of the organic planarizing layer 108, the second hardmask 110, the third hardmask 2202 and the spacers 2602 (of FIG. 33) are removed to expose the first hardmask 106. FIG. 34B illustrates a top view of the first hardmask 106 arranged on the inter-level dielectric layer 104.

Figure 35:
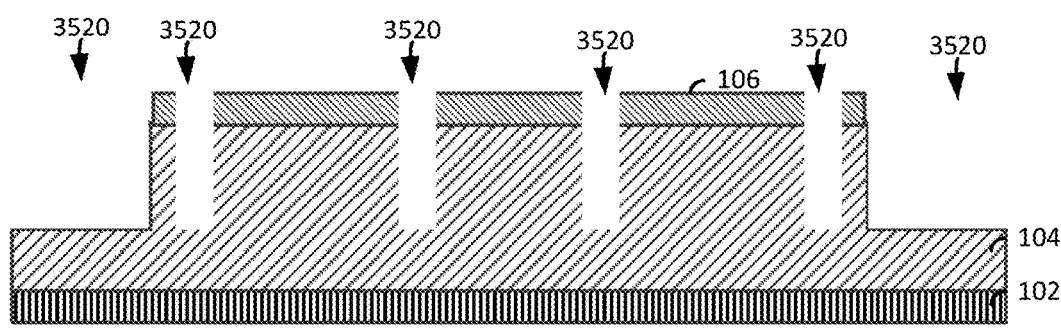

FIG. 35 illustrates a cut-away view following a selective anisotropic etching process such as, for example, reactive ion etching that removes exposed portions of the inter-level dielectric layer 104 to form cavities (trenches) 3502.

Figure 36:
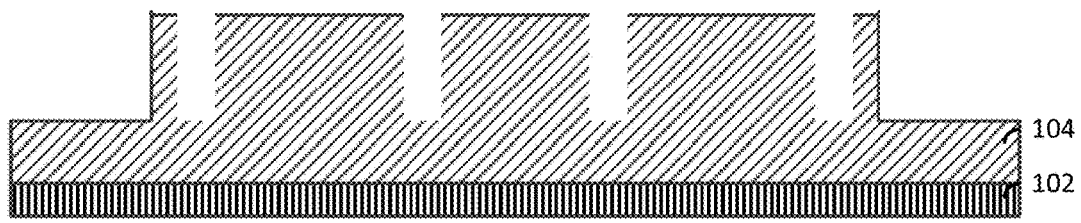

FIG. 36 illustrates a cut-away view following a selective etching process that removes the first hardmask 104 (of FIG. 35).

Figure 37:
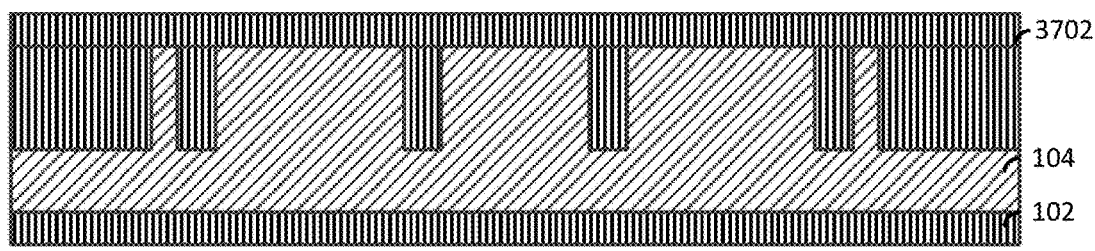

FIG. 37 illustrates a cut-away view following the deposition of a conductive material 3702 such as, for example, copper, silver, gold, aluminum, or another conductive material into the cavities 3502. Prior to depositing the conductive material, a liner layer (not shown) may be formed.

Figure 38A:
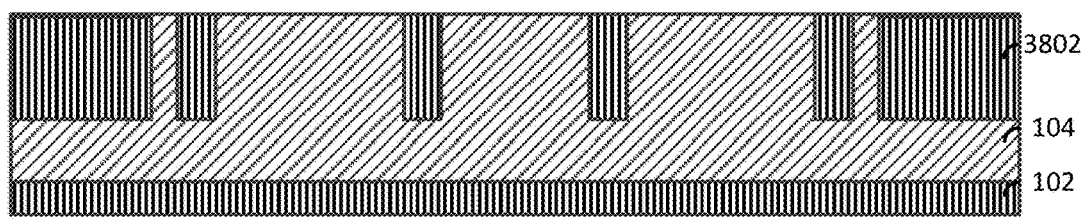
FIG. 38A illustrates a cut-away view along the line A-A (of FIG. 38B) following a planarization process.
Figure 38B:
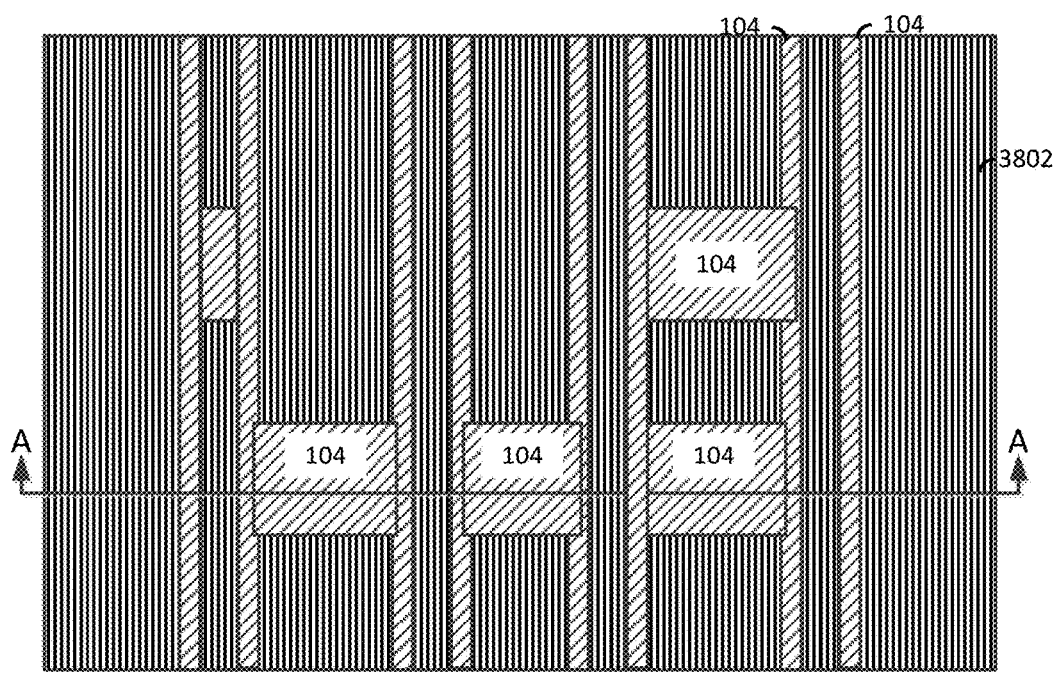

FIG. 38A illustrates a cut-away view along the line A-A (of FIG. 38B) following a planarization process. The planarization process such as, for example, chemical mechanical polishing may be performed to remove overburden material and form conductive lines 3802 in the cavities 3503 (of FIG. 35). FIG. 38B illustrates a top view of the conductive lines 3802 arranged in the inter-level dielectric layer 104.

The embodiments described herein provide for the formation of mandrel lines and non-mandrel lines that are formed from dissimilar materials, and thus, may be selectively etched. The selectivity of the mandrel and non-mandrel lines provides for selectively forming conductive lines in the regions defined by the mandrel and non-mandrel lines.

The embodiments described herein provide for patterning mandrels and non-mandrel lines on the substrate. Such embodiments allow for substantially self-aligning conductive lines with a greater margin of alignment error when patterning using a mask. The greater margin of error in mask alignment allows conductive lines to be formed as the pitch scale of the devices decreases.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with"

another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming conductive lines on a semiconductor wafer, the method comprising:
    forming a first hardmask on an insulator layer, a planarizing layer on the first hardmask, a second hardmask on the planarizing layer and a layer of sacrificial mandrel material on the second hardmask;
    removing portions of the layer of sacrificial mandrel material to expose portions of the second hardmask and form a first sacrificial mandrel and a second sacrificial mandrel on the second hardmask;
    forming spacers adjacent to sidewalls of the first sacrificial mandrel and sidewalls of the second sacrificial mandrel;
    depositing a filler material on the second hardmask between the first sacrificial mandrel and the second sacrificial mandrel;
    forming a first mask on a portion of the second sacrificial mandrel;
    removing exposed portions of the first sacrificial mandrel and the second sacrificial mandrel to form a first cavity and a second cavity that expose portions of the second hardmask;
    removing the first mask;
    forming a second mask that fills the first cavity and the second cavity;
    forming a resist mask over a portion of the filler material;
    removing exposed portions of the second mask and exposed portions of the filler material to expose portions of the first hardmask;
    removing the resist mask;
    removing exposed portions of the first hardmask, the planarizing layer and the second hardmask to expose portions of the insulator layer;
    removing the planarizing layer, the second hardmask, the filler material, the second sacrificial mandrel, and the spacers to expose the first hardmask;
    removing exposed portions of the insulator layer to form a trench in the insulator layer; and
    filling the trench with a conductive material.

2. The method of claim 1, wherein the spacers are formed by:
    depositing a layer of spacer material over the first sacrificial mandrel and the second sacrificial mandrel; and
    etching to remove portions of the layer of spacer material to form the spacers.

3. The method of claim 1, wherein the method further comprises depositing a liner layer in the trench prior to depositing the conductive material.

4. The method of claim 1, wherein the trench defines a conductive line.

5. The method of claim 1, wherein the sacrificial mandrel material, the spacers and the filler material are dissimilar materials.

6. The method of claim 1, wherein the spacers are formed from an oxide material.

7. The method of claim 1, wherein the layer of sacrificial mandrel material includes a semiconductor material.

8. The method of claim 1, wherein the filler material includes a flowable carbide material.

9. A method for forming conductive lines on a semiconductor wafer, the method comprising:
    forming a first hardmask on an insulator layer, a first planarizing layer on the first hardmask, and a second hardmask on the first planarizing layer;
    forming a first mask on the second hardmask;
    removing exposed portions of the second hardmask to expose portions of the first planarizing layer;
    forming a third hardmask on the first hardmask and the exposed portions of the first planarizing layer;
    forming a layer of sacrificial mandrel material on the third hardmask;
    forming a fourth hardmask on the layer of sacrificial mandrel material;
    forming a second mask on the fourth hardmask;
    removing exposed portions of the fourth hardmask and the layer of sacrificial mandrel material to expose portions of the third hardmask and form a first sacrificial mandrel and a second sacrificial mandrel;
    forming spacers adjacent to sidewalls of the first sacrificial mandrel and sidewalls of the second sacrificial mandrel;
    forming a second planarizing layer adjacent to the spacers;
    removing exposed portions of the first sacrificial mandrel and the second sacrificial mandrel to form a first cavity and a second cavity;
    increasing a depth of the first cavity and a depth of the second cavity by removing exposed portions of the third hardmask, the second hardmask, and the first planarizing layer to expose portions of the first hardmask;
    removing exposed portions of the first hardmask to expose portions of the insulator layer;
    removing exposed portions of the insulator layer to form a first trench and a second trench;
    removing the first hardmask; and
    filling the first trench and the second trench with a conductive material.

10. The method of claim 9, wherein the spacers are formed by:
    depositing a layer of spacer material over the first sacrificial mandrel and the second sacrificial mandrel; and
    etching to remove portions of the layer of spacer material to form the spacers.

11. The method of claim 9, further comprising removing exposed portions of the second planarizing layer while increasing the depth of the first cavity and the depth of the second cavity.

12. The method of claim 9, wherein the method further comprises depositing a liner layer in the trench prior to depositing the conductive material.

13. The method of claim 9, wherein the trench defines a conductive line.

14. The method of claim 9, wherein the sacrificial mandrel material, the spacers and the filler material are dissimilar materials.

15. The method of claim 9, wherein the spacers are formed from an oxide material.

16. The method of claim 9, wherein the layer of sacrificial mandrel material includes a semiconductor material.

17. The method of claim 9, wherein the filler material includes a flowable carbide material.

18. The method of claim 9, wherein the spacers are formed from a nitride material.

19. The method of claim 9, wherein the insulator layer includes an oxide material.

20. The method of claim 9, wherein the insulator layer is arranged on a conductive line.

\* \* \* \* \*